United States Patent
Hobbs et al.

(10) Patent No.: US 7,845,072 B2
(45) Date of Patent: Dec. 7, 2010

(54) METHOD AND APPARATUS FOR ADJUSTING A MULTI-SUBSTRATE PROBE STRUCTURE

(75) Inventors: Eric D. Hobbs, Livermore, CA (US); Benjamin N. Eldridge, Danville, CA (US); Lunyu Ma, San Jose, CA (US); Gaetan L. Mathieu, Varennes, CA (US); Steven T. Murphy, Rio Vista, CA (US); Makarand S. Shinde, Livermore, CA (US); Alexander H. Slocum, Bow, NH (US)

(73) Assignee: FormFactor, Inc., Livermore, CA (US)

( * ) Notice: Subject to any disclaimer, the term of this patent is extended or adjusted under 35 U.S.C. 154(b) by 16 days.

(21) Appl. No.: 12/343,260

(22) Filed: Dec. 23, 2008

(65) Prior Publication Data

US 2009/0158586 A1 Jun. 25, 2009

Related U.S. Application Data

(62) Division of application No. 11/165,833, filed on Jun. 24, 2005, now Pat. No. 7,471,094.

(51) Int. Cl.
*H05K 3/30* (2006.01)
(52) U.S. Cl. ............................. 29/834; 29/831; 29/832; 29/842; 324/754; 324/755; 324/756; 324/757; 324/758; 324/762
(58) Field of Classification Search .................. 29/842, 29/831, 832, 834; 324/754–758, 762
See application file for complete search history.

(56) References Cited

U.S. PATENT DOCUMENTS 3,730,016 A 5/1973 Miller (Continued)

FOREIGN PATENT DOCUMENTS

JP 2000-147063 * 5/2000

OTHER PUBLICATIONS

U.S. Appl. No. 60/594,562, Benjamin N. Eldridge, filed Apr. 19, 2005.

(Continued)

*Primary Examiner*—Derris H Banks
*Assistant Examiner*—Jeffrey Carley
(74) *Attorney, Agent, or Firm*—Kirton & McConkie

(57) ABSTRACT

A probe card assembly comprises multiple probe substrates attached to a mounting assembly. Each probe substrate includes a set of probes, and together, the sets of probes on each probe substrate compose an array of probes for contacting a device to be tested. Adjustment mechanisms are configured to impart forces to each probe substrate to move individually each substrate with respect to the mounting assembly. The adjustment mechanisms may translate each probe substrate in an "x," "y," and/or "z" direction and may further rotate each probe substrate about any one or more of the forgoing directions. The adjustment mechanisms may further change a shape of one or more of the probe substrates. The probes can thus be aligned and/or planarized with respect to contacts on the device to be tested.

22 Claims, 29 Drawing Sheets

U.S. PATENT DOCUMENTS

| | | | |
|---|---|---|---|
| 5,642,056 A | 6/1997 | Nakajima et al. | |
| 5,806,181 A | 9/1998 | Khandros et al. | |
| 5,974,662 A * | 11/1999 | Eldridge et al. | 29/842 |
| 6,072,325 A | 6/2000 | Sano | |
| 6,096,567 A | 8/2000 | Kaplan et al. | |
| 6,330,744 B1 * | 12/2001 | Doherty et al. | 29/825 |
| 6,496,026 B1 * | 12/2002 | Long et al. | 324/762 |
| 6,509,751 B1 * | 1/2003 | Mathieu et al. | 324/754 |
| 6,640,415 B2 | 11/2003 | Eslamy et al. | |
| 6,690,185 B1 | 2/2004 | Khandros et al. | |
| 6,784,678 B2 | 8/2004 | Pietzschmann | |
| 6,794,888 B2 * | 9/2004 | Kawaguchi et al. | 324/754 |
| 7,084,650 B2 | 8/2006 | Cooper et al. | |
| 7,119,566 B2 | 10/2006 | Kim | |
| 7,202,682 B2 | 4/2007 | Cooper et al. | |
| 7,255,575 B2 * | 8/2007 | Hasegawa | 439/71 |
| 7,262,611 B2 | 8/2007 | Mathieu et al. | |
| 7,285,968 B2 | 10/2007 | Eldridge et al. | |
| 7,471,094 B2 | 12/2008 | Hobbs et al. | |
| 2001/0012739 A1 | 8/2001 | Grube et al. | |
| 2007/0063719 A1 * | 3/2007 | Yamada | 324/754 |
| 2007/0126435 A1 | 6/2007 | Eldridge et al. | |
| 2007/0126440 A1 | 6/2007 | Hobbs et al. | |
| 2008/0007281 A1 | 1/2008 | Garabedian et al. | |
| 2008/0036480 A1 | 2/2008 | Hobbs et al. | |
| 2008/0048688 A1 | 2/2008 | Mathieu et al. | |

OTHER PUBLICATIONS

U.S. Appl. No. 09/527,931, Mathieu et al., filed Mar. 17, 2000.
PCT/US06/24238 Search Report and Written Opinion (Sep. 24, 2007), 11 pages.
PCT/US06/24238 Preliminary Report on Patentability (Jan. 10, 2008), 8 pages.

* cited by examiner

METHOD AND APPARATUS FOR ADJUSTING A MULTI-SUBSTRATE PROBE STRUCTURE

CROSS-REFERENCE TO RELATED APPLICATION(S)

This application is a divisional of U.S. patent application Ser. No. 11/165,833, which was filed Jun. 24, 2005 and is now U.S. Pat. No. 7,471,094.

BACKGROUND OF THE INVENTION

FIG. 1 illustrates an exemplary probing system 90 for testing electronic devices, which may be, for example, dies (not shown) on a newly manufactured semiconductor wafer 12. The probing system 90 of FIG. 1 includes a test head 4 and a prober 2 (which is shown with a cut-away 26 to provide a partial view of the inside of the prober 2). To test the dies (not shown) of the semiconductor wafer 12, the wafer 12 is placed on a moveable stage 6 as shown in FIG. 1, and the stage 6 is moved such that terminals 22 on dies (not shown) of the wafer 12 are brought into contact with probes 66 of a probe card assembly 20. Temporary electrical connections are thus established between the probes 66 and dies (not shown) of the wafer 12 to be tested.

Typically, a cable 10 or other communication means connects a tester (not shown) with the test head 4. Electrical connectors 14 electrically connect the test head 4 with the probe card assembly 20, and the probe card assembly 20 includes electrical paths (not shown) to the probes 66. The cable 10, test head 4, electrical connectors 14, and probe card assembly 20 (which includes probes 66) thus provide electrical paths between the tester (not shown) and the die terminals 22 of the wafer 12 being tested. Thus, while the probes 66 are in contact with the terminals 22 of the dies (not shown) on the wafer 12, cable 10, test head 4, electrical connectors 14, and probe card assembly 20 provide a plurality of electrical paths between the tester (not shown) and the dies (not shown). The tester (not shown) writes test data through these electrical paths to the dies (not shown), and response data generated by the dies in response to the test data is returned to the tester through these electrical paths.

A typical wafer 12 comprises numerous dies (not shown). Indeed, a wafer 12 may include dozens or even hundreds of dies (not shown). Typically, probe card assembly 20 is not capable of contacting all of the dies (not shown) on a wafer 12. To test all of the dies (not shown) on a wafer 12, the stage 6 moves some of the dies (not shown) of wafer 12 into contact with the probes 66 of the probe card assembly 20, and the tester (not shown) runs tests on those dies (not shown). The stage 6 then moves the wafer 12 such that others of the dies (not shown) contacted the probes 66, and the tester (not shown) runs the same tests on those dies. This process of moving the wafer 12 to bring some of the dies (not shown) into contact with the probes 66 and testing those dies (not shown) continues until all of the dies (not shown) of the wafer 12 are tested.

As probe card assembly technology has advanced, the size of the array of probes 66 has been increased in order to contact more dies (not shown). One strategy for creating large probe arrays 66 involves using multiple probe substrates 66. That is, multiple probe substrates 66, each comprising a plurality of probes, are positioned adjacent one another so that the probes on probe substrates 66 form a large array of probes. U.S. Pat. No. 5,806,181, U.S. Pat. No. 6,690,185, U.S. Pat. No. 6,640,415, and U.S. Pat. No. 6,509,751 (each of which is incorporated herein by reference in its entirety) disclose nonlimiting examples of probe card assemblies with multiple probe substrates. The probes 66 and die terminals 22, both of which are typically small, must be precisely aligned, which necessitates precise positioning of the multiple probe substrates. Methods and apparatuses for precisely positioning such probe substrates are needed.

SUMMARY

In an exemplary embodiment, multiple probe substrates are attached to a mounting assembly. Each probe substrate includes a set of probes, and together, the sets of probes on the probe substrates compose an array of probes for contacting a device to be tested. Adjustment mechanisms are configured to impart forces to each probe substrate to move individually each substrate with respect to the mounting assembly. The adjustment mechanisms may translate each probe substrate along an "x," "y," and/or "z" axis and may further rotate each probe substrate about one or more of the forgoing axes. The adjustment mechanisms may further change a shape of one or more of the probe substrates. The probes can thus be aligned and/or planarized with respect to contacts on the device to be tested.

DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein.

Figure 1:
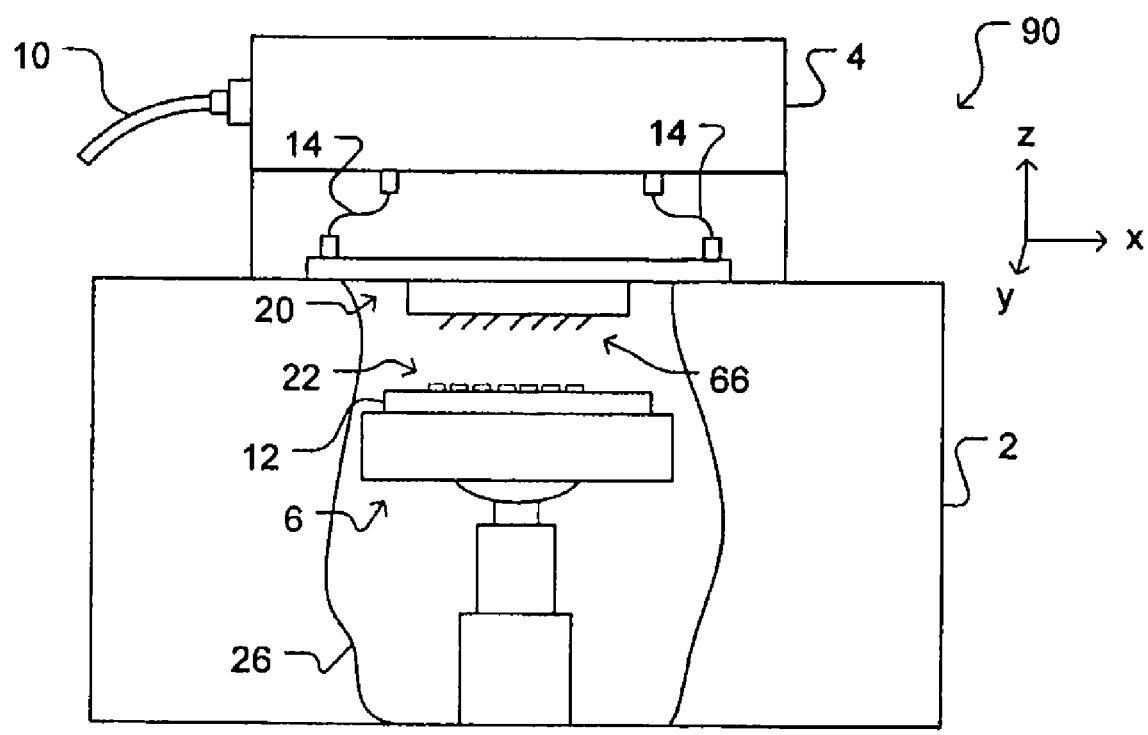
FIG. 1 illustrates an exemplary probing system for testing dies of a semiconductor wafer.
Figure 2A:
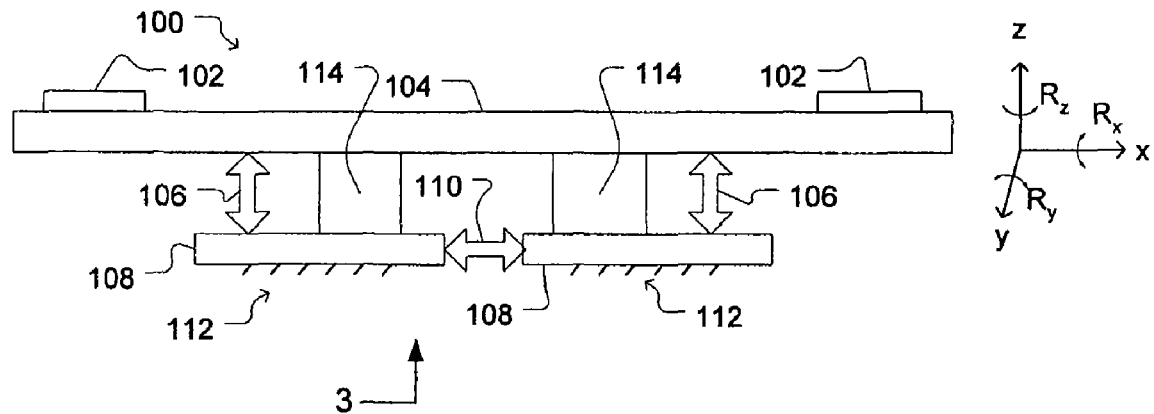
FIG. 2A illustrates a side view of an exemplary probe card assembly.
Figure 3:
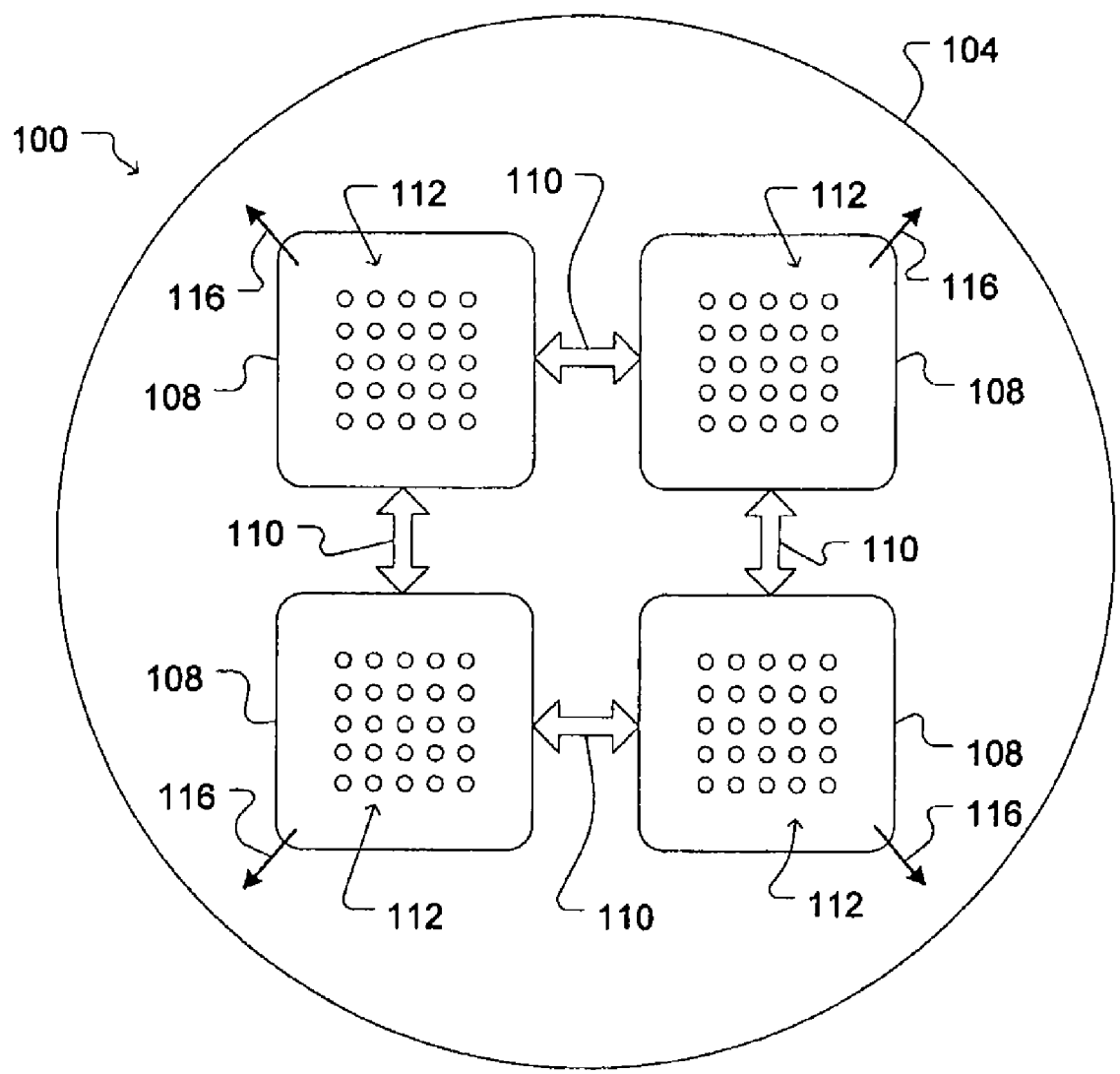
FIG. 3 illustrates a bottom view of the probe card assembly of FIG. 2A.

FIGS. 2A and 3 illustrate a simplified block diagram of an exemplary probe card assembly 100 that includes a plurality of probe substrates 108. (FIG. 2A shows a side view and FIG. 3 shows a bottom view of the probe card assembly 100.) A set of probes 112 is attached to each probe substrate 108, and the probe substrates 108 are arranged so that the probe sets 112 form a large array of probes. Although four probe substrates 108 are shown, fewer or more may be used. The probe card assembly 100 may be used in a probing system like system 90 of FIG. 1 in place of probe card assembly 20, and for ease of discussion, the probe card assembly 100 will be discussed herein with regard to probing system 90.

As shown in FIGS. 2A and 3, the probe card assembly 100 includes connectors 102, a mounting assembly 104, and probe substrates 108 each with a set of probes 112. Connection mechanisms 114 physically connect the probe substrates 108 to the mounting assembly 104. First adjustment mechanisms 106 and second adjustment mechanisms 110 are configured to adjust the positions of the probe substrates 108 with respect to the mounting assembly 104. The depiction in FIGS. 2A and 3 is not necessarily in proportion. For example, the probe substrates 108 may be spaced closer together but are depicted in FIGS. 2A and 3 for ease of illustration.

Connectors 102 are configured to make electrical connections with a test head 4 (see FIG. 1). For example, connectors 102 may be any type of electrical connector including without limitation zero insertion force ("ZIF") connectors or pogo pads for receiving pogo pin connectors.

Figure 2B:
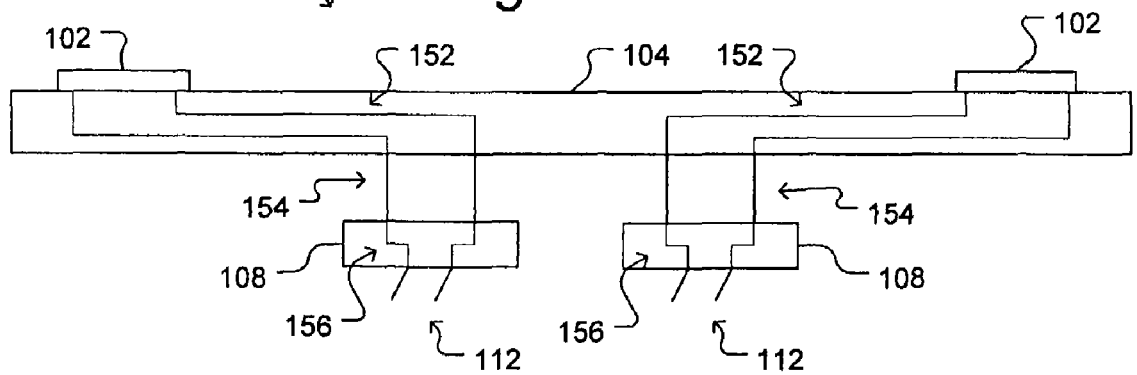
FIG. 2B shows a simplified electrical schematic diagram of the probe card assembly of FIG. 2A.

FIG. 2B shows a schematic diagram of the probe card assembly 100 in which electrical paths 152 (e.g., conductive traces and/or vias) through the mounting assembly 104, electrical connections 154 (e.g., wires, an interposer, etc.) between the mounting assembly 104 and the probe substrates 108, and electrical paths 156 (e.g., conductive traces and/or vias) through the probe substrates 108 electrically connect connectors 102 with probe sets 112.

In addition to providing electrical paths 152, the mounting assembly 104 is also configured to be securely attached to a prober 2 of a probing system like system 90 of FIG. 1. For example, the mounting assembly 104 may be bolted (not shown), clamped (not shown), or otherwise secured to a prober 2.

Figure 2C:
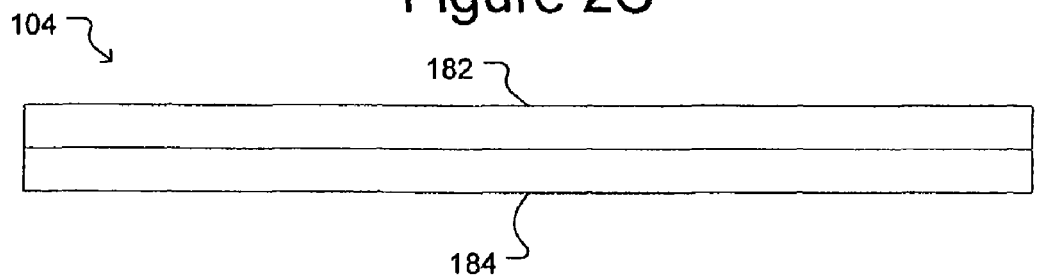
FIG. 2C shows a simplified block diagram of an exemplary implementation of the mounting assembly of the probe card assembly of FIG. 2A.
Figure 5:
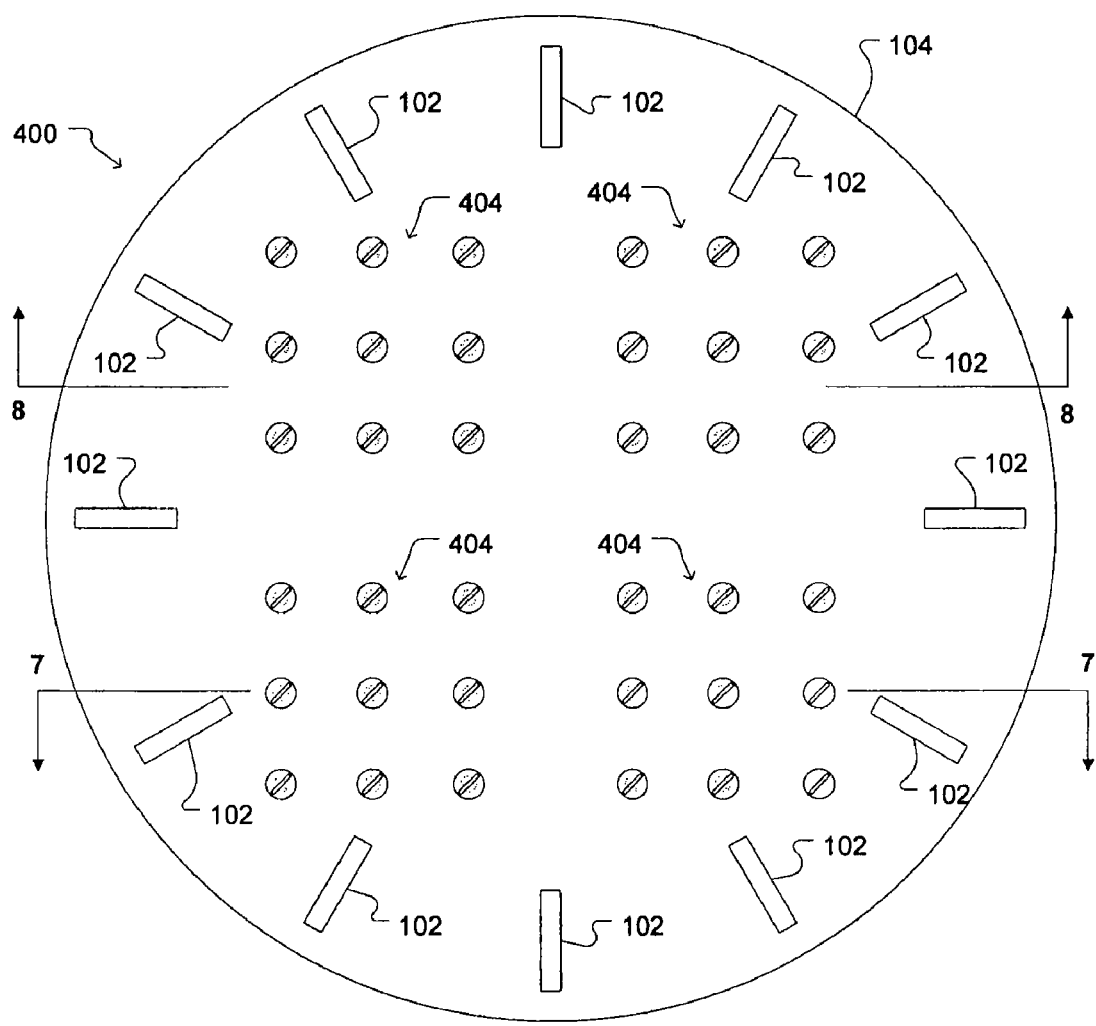
FIG. 5 illustrates a top view of the probe card assembly of FIG. 4.

As shown in FIG. 2C, which shows a simplified block diagram of an exemplary mounting assembly 104, the mounting assembly 104 may include a stiffener plate 182 and a wiring substrate 184. The wiring substrate 184 provides the electrical paths 152 from connectors 102 (not shown in FIG. 2C) through the mounting assembly 104. The wiring substrate 184 may be, for example, a printed circuit board. The stiffener plate 182 provides mechanical stiffness that resists warping, thermally induced movement, etc. The wiring substrate 184 may be secured to the prober 2 (see FIG. 1), and the stiffener plate 182 may be attached to the wiring substrate 184 to stiffen the wiring substrate 184. An example is shown in FIG. 5 of U.S. Pat. No. 5,974,662 in which the printed circuit board 502 is an example of a wiring substrate 184 and mounting plates 530, 532 are examples of a stiffener plate 182. Alternatively, the stiffener plate 184 may be secured to the prober 2, and the wiring substrate 184 may be attached to the stiffener plate 182. Examples are shown in Provisional Patent Application No. 60/594,562, entitled Apparatus And Method For Managing Thermally Induced Motion In A Probe Card Assembly (filed Apr. 19, 2005). For example, the stiffener plate 202 shown throughout the drawings in Provisional Patent Application No. 60/594,562 is an example of stiffener plate 182, and wiring substrate 204 also shown throughout the drawings in Provisional Patent Application No. 60/594,562 is an example of wiring substrate 184. The aforementioned U.S. Pat. No. 5,974,662 and Provisional Patent Application No. 60/594,562 are incorporated herein by reference in their entirety.

The attachment mechanisms 114, which are represented generically as boxes in FIG. 2A, are, as mentioned above, configured to physically connect the probe substrates 108 to the mounting assembly 104. Preferably, the attachment mechanisms 110 physically connect the probe substrates 108 to the stiffener plate 182 portion of the mounting assembly 104. In addition, the attachment mechanisms 114 may be configured to bias the probe substrates 108 in particular directions. In the example shown in FIG. 3, the probe substrates 108 are biased in the directions of arrows 116, which as shown in FIG. 3, biases each probe substrate 108 away from the other probe substrates. As an example of an alternative biasing arrangement, one probe substrate 108 may not be biased in any direction but may act as a reference away from which each of the other probe substrates 108 is biased. For example, the probe substrate 108 located in the lower right corner of FIG. 3 may alternatively not be biased in any direction, while each of the other three probe substrates is biased away from the other probe substrates in the direction of arrows 116.

Each probe substrate 108 comprises a platform for a probe set 112 and includes electrical paths 156 (see FIG. 2B) through the probe substrate 108 to probes 112. A probe substrate 108 may comprise, for example, a ceramic or an organic substrate with conductive traces (not shown) and conductive vias (not shown) forming electrical paths 156.

Probes 112 may be a resilient, conductive structure. Nonlimiting examples of suitable probes 112 include composite structures formed of a core wire bonded to a conductive terminal (not shown) on a probe substrate 108 that is over coated with a resilient material as described in U.S. Pat. No. 5,476,211, U.S. Pat. No. 5,917,707, and U.S. Pat. No. 6,336,269, all of which are incorporated in their entirety herein by reference. Probes 112 may alternatively be lithographically formed structures, such as the spring elements disclosed in U.S. Pat. No. 5,994,152, U.S. Pat. No. 6,033,935, U.S. Pat. No. 6,255,126, U.S. Patent Application Publication No. 2001/0044225, and U.S. Patent Application Publication No. 2001/0012739, each of which is also incorporated in its entirety herein by reference. Other nonlimiting examples of probes 112 include conductive pogo pins, bumps, studs, stamped springs, etc.

First adjustment mechanisms 106 and second adjustment mechanisms 110 allow the position of each probe substrate 108 to be changed with respect to the mounting assembly 104. Because the mounting assembly 104 is securely attached to the prober 2, the position of each probe substrate 108 is also changed with respect to the prober 2 and the wafer 12 to be tested (see FIG. 1) that is disposed on the stage 6 (see FIG. 1). The probes 112 can thus be aligned and/or planarized with the die terminals 22.

Preferably, the first adjustment mechanisms 106 and the second adjustment mechanisms 110 are configured to impart six degrees of movement to each probe substrate 108. In FIG. 2A, those six degrees of movement are labeled as follows: the horizontal direction across the page of FIG. 2A is labeled "x," the horizontal direction into and out of the page of FIG. 2A is labeled "y," the vertical direction is labeled "z," rotation about the "x" axis is labeled $R_x$, rotation about the "y" axis is labeled $R_y$, and rotation about the "z" axis is labeled $R_z$. The forgoing directions are provided for ease of discussion and are not limiting.

The first adjustment mechanisms 106 are configured to move one or more portions of a probe substrate 108 in the "z" direction. The first adjustment mechanisms 106 are thus able to move each probe substrate 108 in three degrees of motion: translation along the "z" axis, rotation $R_x$ about the "x" axis, and rotation $R_y$ about the "y" axis. The second adjustment mechanisms 110 are configured to move one or more portions of a probe substrate 108 in the "x, y" plane. The second adjustment mechanisms 110 are thus able to move each probe substrate 108 in three additional degrees of motion: translation along the "x" axis, translation along the "y" axis, and rotation $R_z$ about the "z" axis.

FIGS. 4-8 illustrate an exemplary probe card assembly 400 in which each of the attachment mechanisms 114 of FIGS. 2A and 3 comprises a frame 410 and spring assemblies 408, each of the first adjustment mechanisms 106 comprises differential screws 404, and each of the second adjustment mechanisms 110 comprises cam assemblies 406. As shown, the probe card assembly 400 also includes connectors 102, mounting assembly 104, probe substrates 108, and probes 112 as in FIGS. 2A and 3. (For ease of illustration, the depictions in FIG. 4-8 are not necessarily in proportion. For example, the probe substrates 108 may be spaced closer together but are depicted in FIGS. 4-8 for ease of illustration.)

Figure 4:
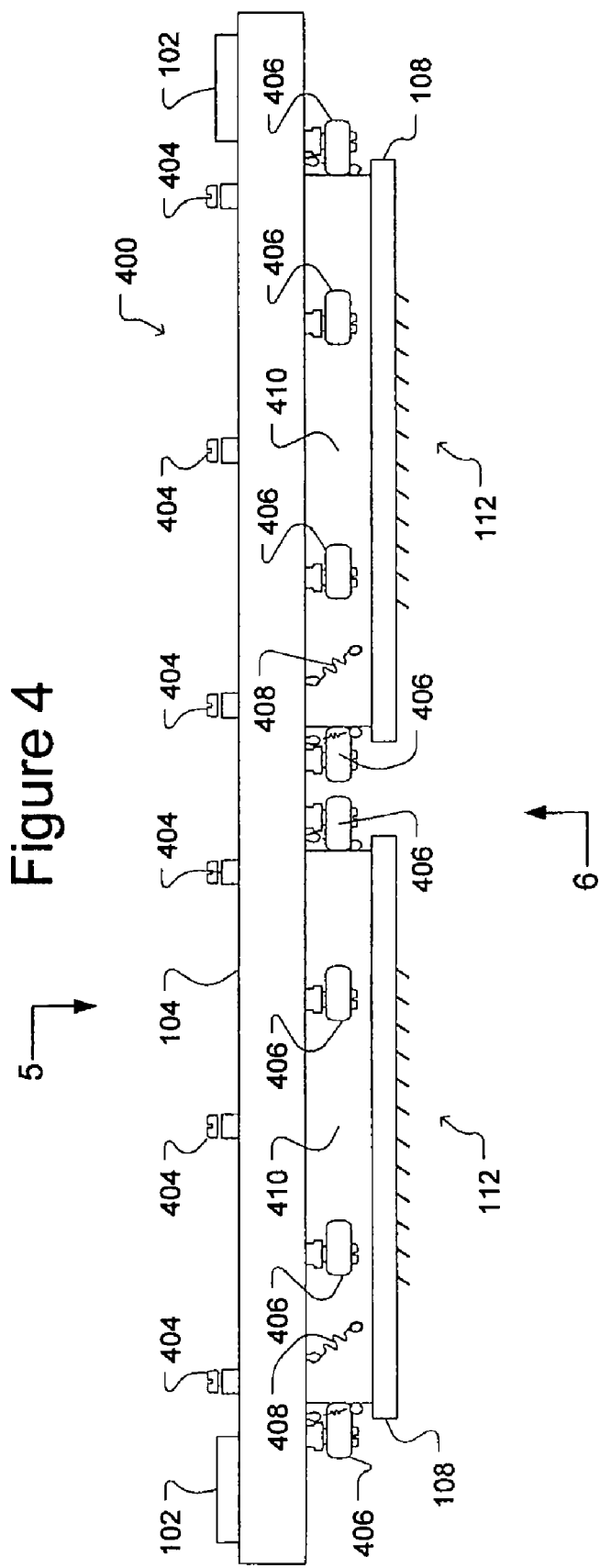
FIG. 4 illustrates a side view of another exemplary probe card assembly.
Figure 6:
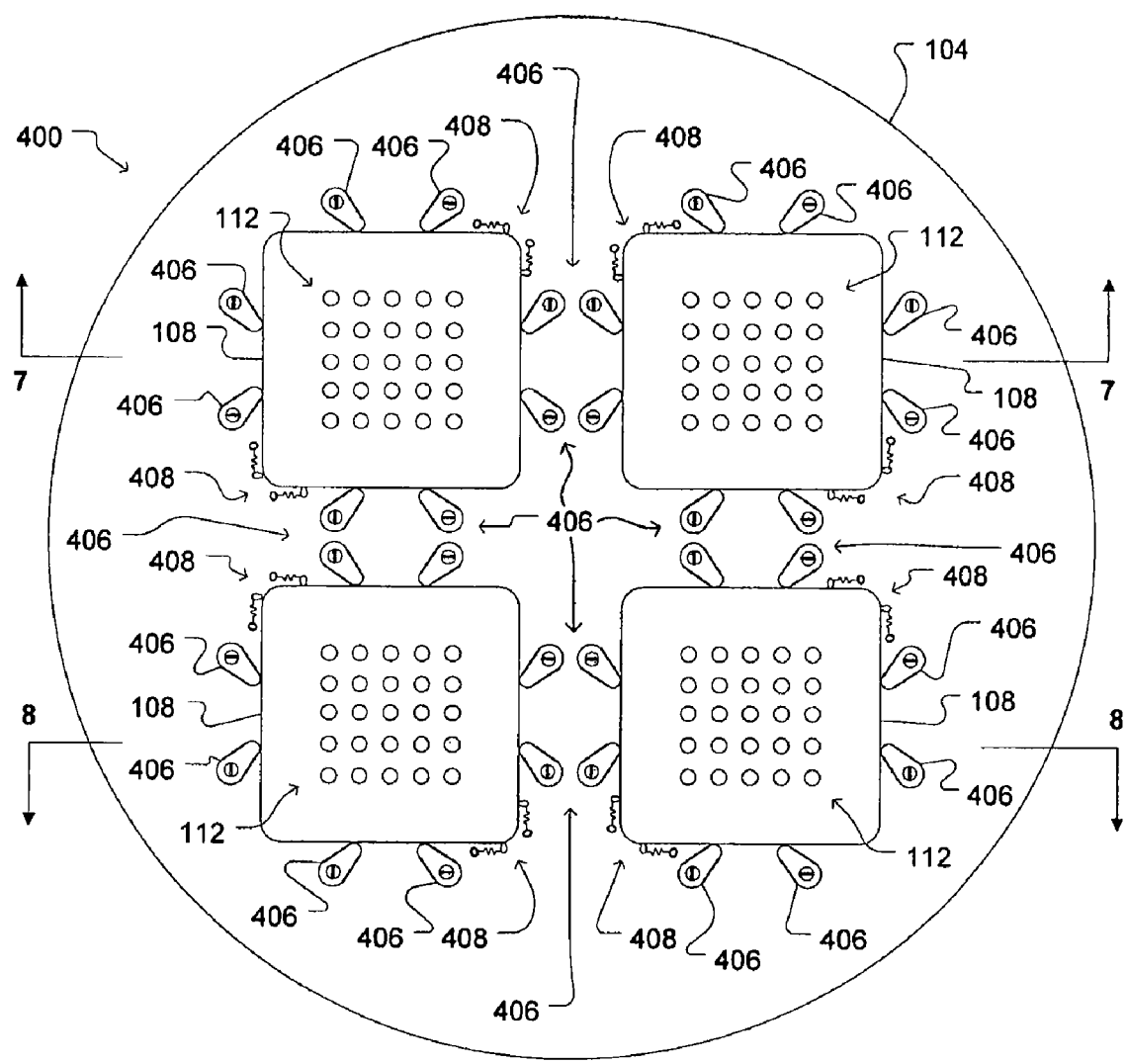
FIG. 6 illustrates a bottom view of the probe card assembly of FIG. 4.
Figure 8:
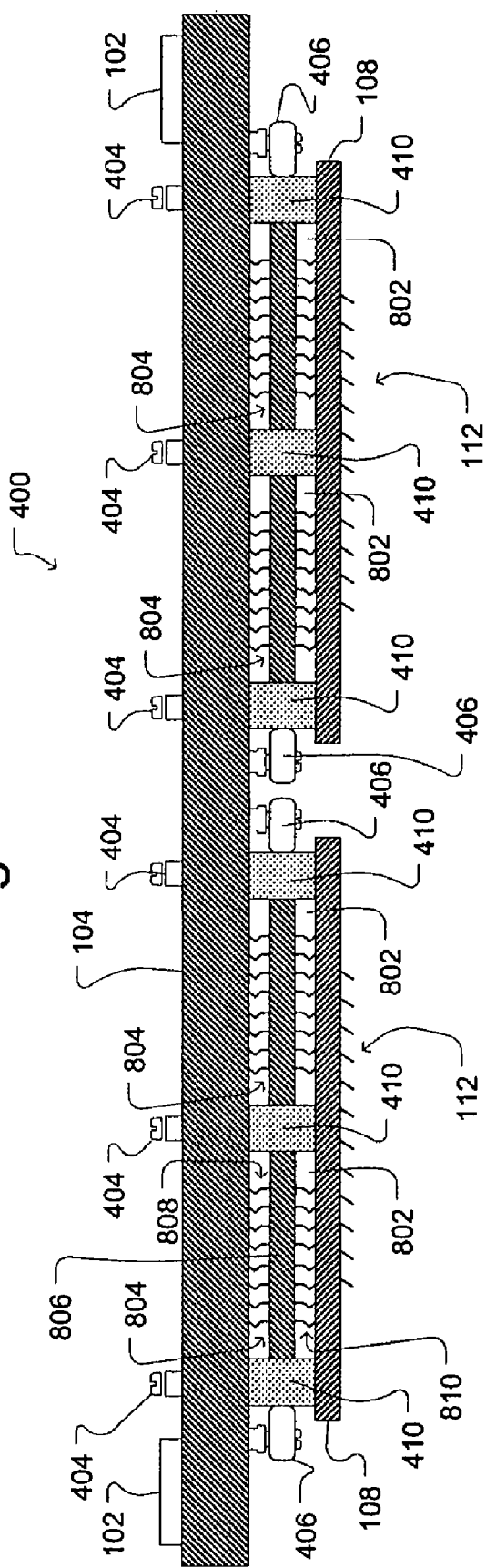
FIG. 8 illustrates another cross-sectional side view of the probe card assembly of FIG. 4.
Figure 9:
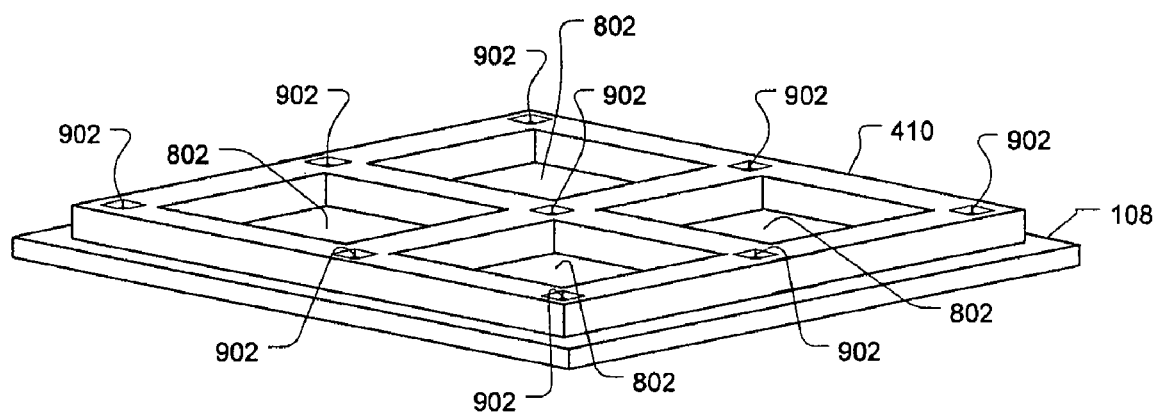
FIG. 9 shows a side perspective view of a probe substrate and frame.

As mentioned above, an attachment mechanism 114 of FIGS. 2A and 3 is implemented in probe card assembly 400 as a frame 410 and spring assemblies 408. As shown in FIGS. 4 and 6, a plurality of spring assemblies 408 attaches a frame 410 to the mounting assembly 104. FIG. 9 shows an elevated, perspective view of an exemplary frame 410, which includes open spaces 802. A probe substrate 108 is attached to the frame 410, which attachment may be effected with bolts, clamps, glue, an adhesive, etc. As shown in FIG. 8, which shows a side, cross-sectional view of the probe card assembly 400, an interposer 804 fits within each of the spaces 802 of the frame 410. As also shown in FIG. 8, each interposer 804 preferably comprises a first set of electrically conductive spring elements 808 for contacting the mounting assembly 104 and a second set of electrically conductive spring elements 810 for contacting the probe substrate 108. The first set of spring contact elements 808 is electrically connected through the interposer substrate 806 to the second set of spring contact elements 810. Each interposer 804 thus provides the electrical paths 154 (see FIG. 2B) between the mounting assembly 104 and the probe substrates 108, and because contact elements 808, 810 are springs, those electrical paths 154 are compliant (i.e., the electrical paths 154 remain established even as the position of a probe substrate 108 with respect to the mounting assembly 104 is changed by cam assemblies 406 and differential screw assemblies 404). Contact elements 808, 810 may be constructed like probes 112, as discussed above. The interposer 504 in FIG. 5 of the aforementioned U.S. Pat. No. 5,974,662 and interposer 230 in FIG. 2A of U.S. Pat. No. 6,509,751 (which is incorporated herein in its entirety by reference) are nonlimiting examples of suitable interposers 804. Although spaces 802 in each frame 410 are provided for four interposers 804 per probe substrate 108, fewer or more interposers 804 per probe substrate 108 may be used.

Figure 10A:
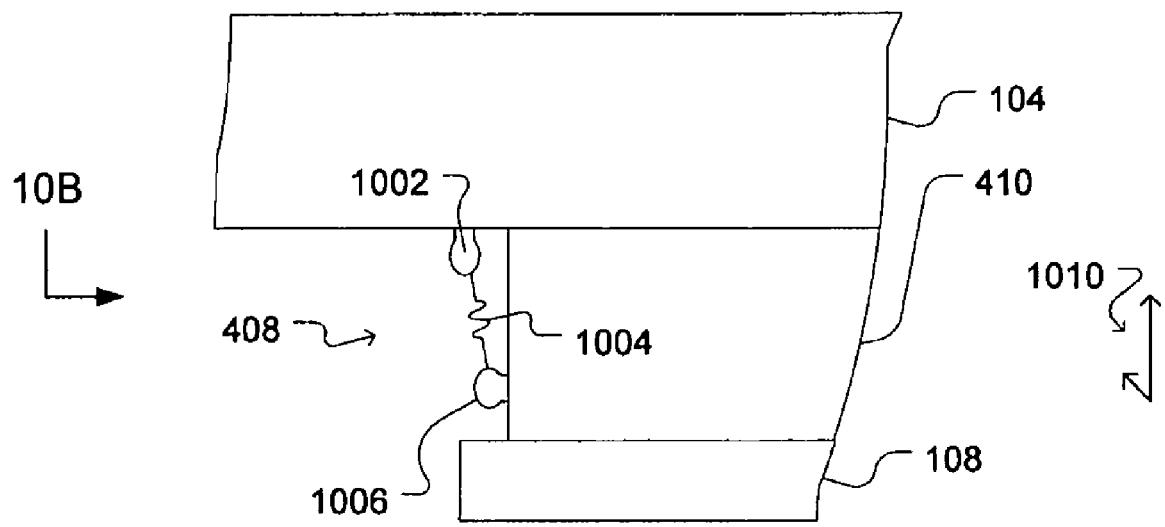
FIGS. 10A and 10B illustrate partial side views of the probe card assembly of FIG. 4 showing a spring assembly.
Figure 10B:
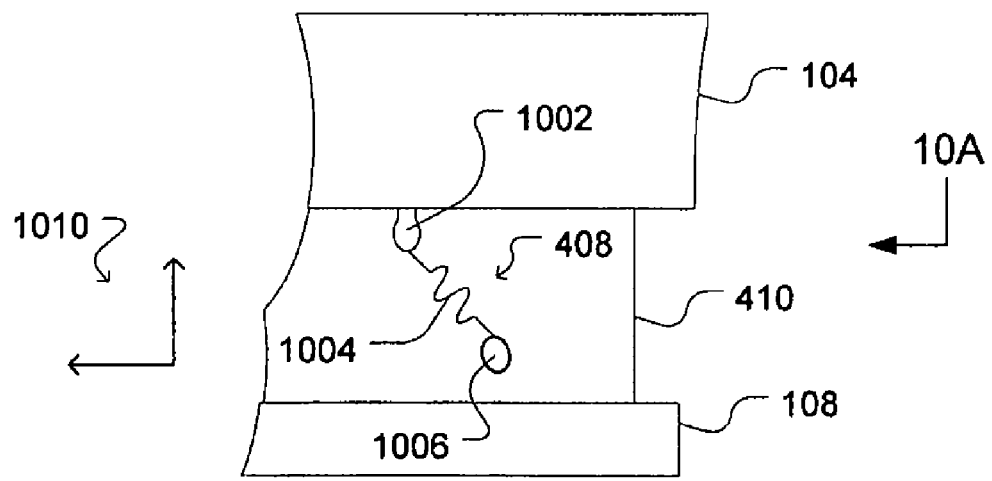

As shown in FIG. 6 (which shows a bottom view of the probe card assembly 400), each frame (which is hidden behind probe substrates 108 in FIG. 6) is attached to the mounting assembly 104 by a plurality of spring assemblies 408. FIGS. 10A and 10B show detailed side and front views, respectively, of one such spring assembly 408. As shown in FIGS. 10A and 10B, the spring assembly 408 includes a pin 1002 attached to the mounting assembly 104 and a pin 1006 attached to the frame 410. (The mounting assembly 104, frame 410, and probe substrate 108 are shown in partial view in FIGS. 10A and 10B.) Frame pin 1006 may be integrally formed with frame 410 or, alternatively, frame pin 1006 may be threaded or wedged into a hole (not shown) in the frame 410. Assembly pin 1002 may be similarly integrally formed with the mounting assembly 104 or threaded or wedged into a hole (not shown) in the mounting assembly 104. Alternatively, pin 1002 and pin 1006 may be glued, welded, adhered, brazed, soldered, or otherwise attached to the mounting assembly 104 and the frame 410, respectively.

Spring 1004 is attached to both the assembly pin 1002 and the frame pin 1006. The spring 1004 may be any suitable spring structure and may be attached to the assembly pin 1002 and the frame pin 1006 in any suitable manner (e.g., the ends of the spring 1004 may be secured in holes (not shown) in the pins 1002, 1006, the ends of the spring 1004 may be wrapped around pins 1002, 1006, etc.).

The spring assembly 408 not only attaches the frame 410 to the mounting assembly 104, the spring assembly 408 also biases the probe substrate 108. With regard to FIG. 10A, the spring assembly 408 biases the probe substrate 108 (which is attached to the frame 410) upward and into the page, as shown by arrows 1010 in FIG. 10A. In FIG. 10B, which shows a side view of FIG. 10A, the directions of bias are upward and to the left, as shown by arrows 1010. By selective placement of the spring assemblies 408, the probe substrates 108 may be biased in any desired directions. For example, the placement of spring assemblies 408 on probe card assembly 400 as shown in FIG. 6 (which shows a bottom view of the probe card assembly 400) biases the four probe substrates 108 shown in FIG. 6 away from each other (similar to direction arrows 116 in FIG. 3) and toward the mounting assembly 104.

Figure 11A:
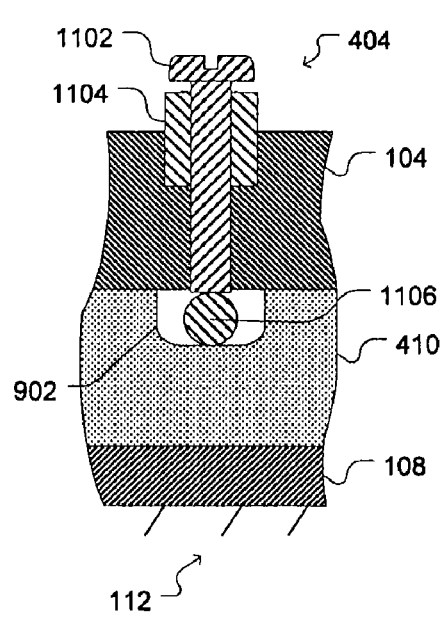
FIGS. 11A and 11B illustrate partial cross-sectional side views of the probe card assembly of FIG. 4 showing a differential screw assembly.
Figure 11B:
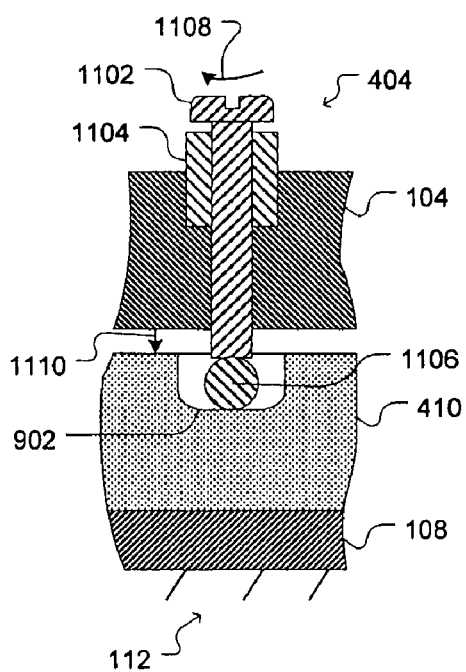

As mentioned above and shown in FIG. 7, the first adjustment mechanisms 106 of FIGS. 2A and 3 are implemented in probe card assembly 400 of FIGS. 4-8 as a plurality of differential screw assemblies 404 and corresponding pivot spheres 1106. FIG. 11A shows a detailed cross-sectional view of one such differential screw assembly 404 and corresponding pivot sphere 1106. (FIG. 11A shows the mounting assembly 104, frame 410, and probe substrate 108 in partial view.) As shown, the differential screw assembly 404 includes an outer threaded element 1104 that is firmly and immovably secured to the mounting assembly 104. A screw 1102 threads into the outer element 1104. As shown in FIG. 11B, as the screw 1102 is rotated 108 in one direction, it moves downward against the pivot sphere 1106, which is disposed in a recess 902 in the frame 410, pushing the frame 410 (and thus also the probe substrate 108) away from the mounting assembly 104. Rotating the screw 1102 in the opposite direction (not shown), retracts the screw 1102 away from the pivot sphere 1106, and the spring action of the spring assemblies 408 (which, as discussed above, bias the frame 410 toward the mounting assembly 104) moves the frame 410 with the screw 1102.

Figure 7:
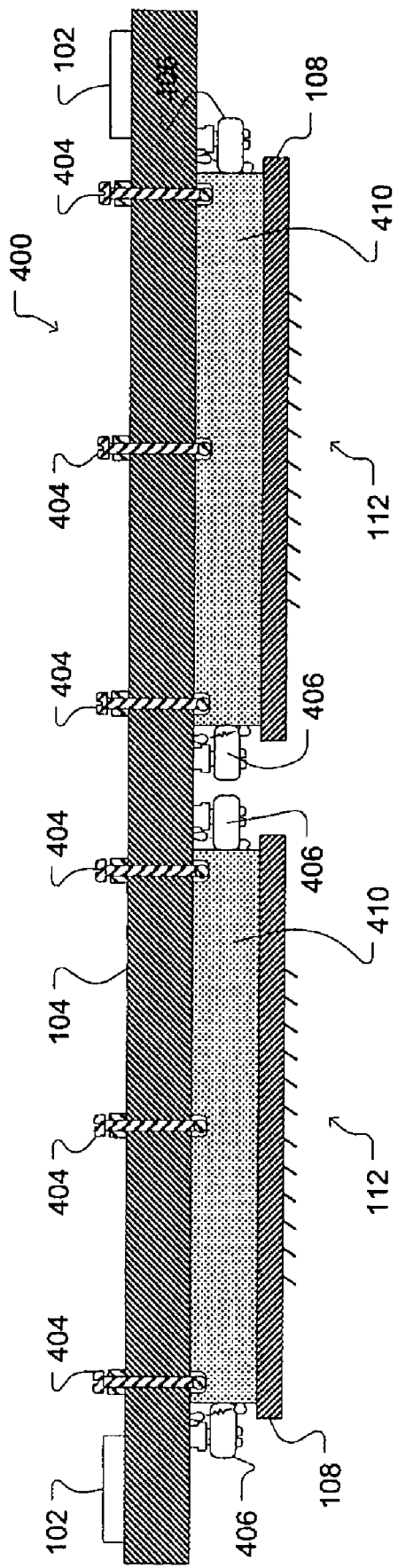
FIG. 7 illustrates a cross-sectional side view of the probe card assembly of FIG. 4.
Figure 14:
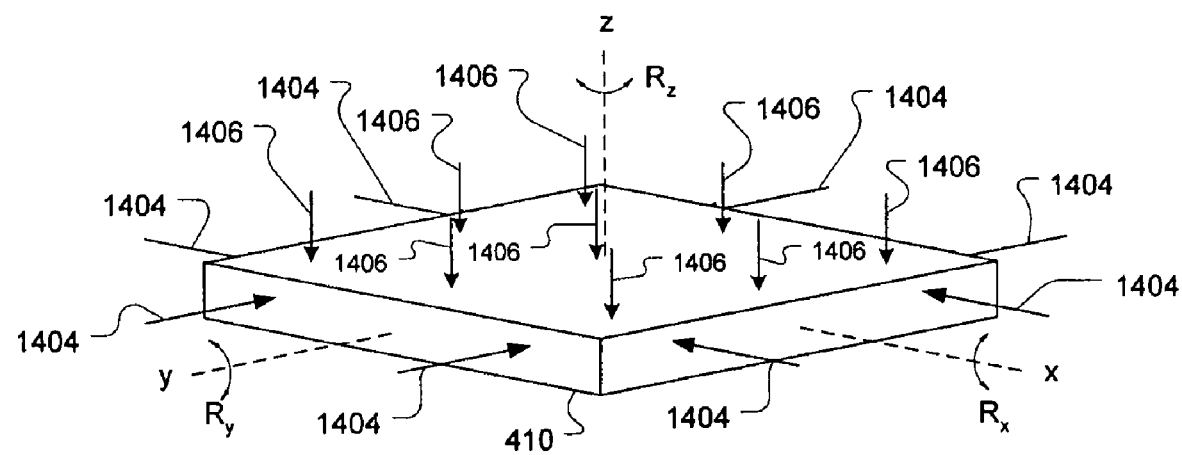
FIG. 14 shows forces that can be applied to a probe substrate of the probe card assembly of FIG. 4.

As shown in FIG. 9, frame 410 has nine recesses 902 for nine pivot spheres 1106 (not shown in FIG. 9) and is thus configured to be moved by nine differential screw assemblies 404. (FIG. 7, which shows a cross-sectional side view of the probe card assembly 400, shows three such differential screw assemblies 404 for each of two frames 410 that are shown in FIG. 7.) As shown in FIG. 14, the nine differential screw assemblies 404 bring nine forces 1406 to bear against a frame 410 (shown in block diagram form in FIG. 14), and by selective application of each of those nine forces 1406, the frame 410 (and thus the probe substrate 108 not shown in FIG. 14) attached to the frame can be translated along the "z" axis and rotated ($R_x$, $R_y$) about both the "x" and "y" axes. Of course, however, fewer or more than nine differential screw assemblies 404 may be used to adjust one probe substrate 108.

Figure 12A:
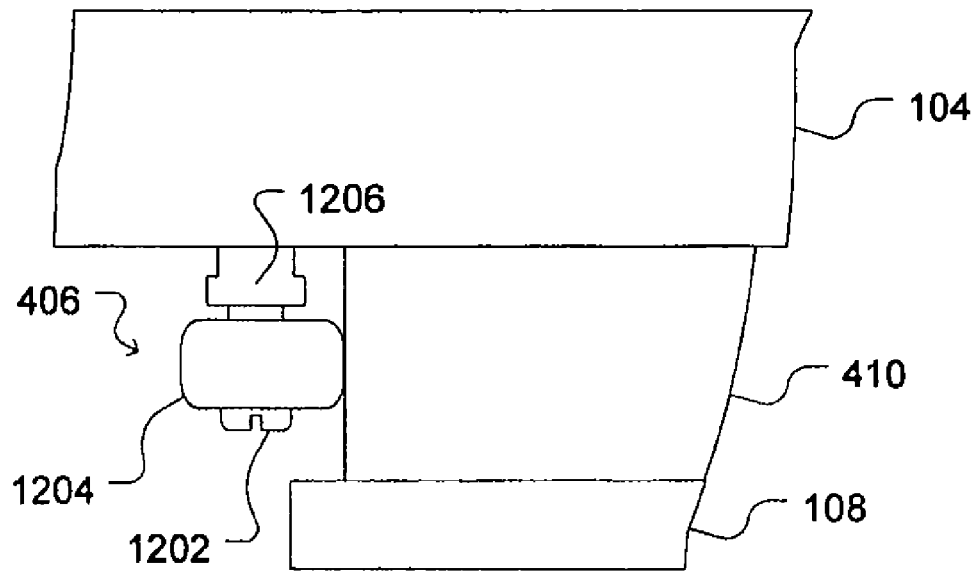
FIGS. 12A and 12B illustrate partial side views of the probe card assembly of FIG. 4 showing a cam assembly.
Figure 12B:
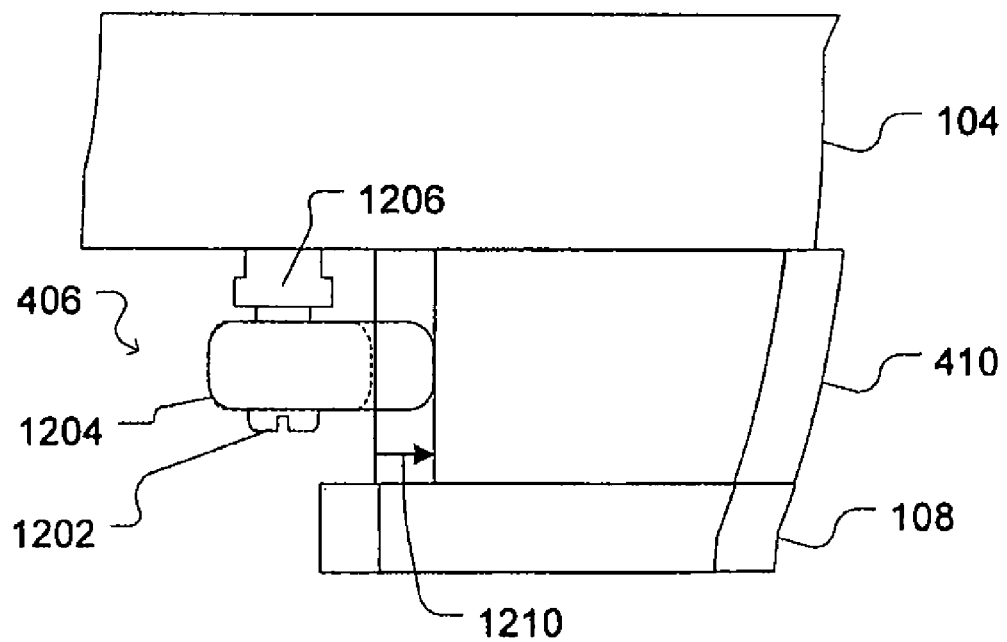
Figure 13A:
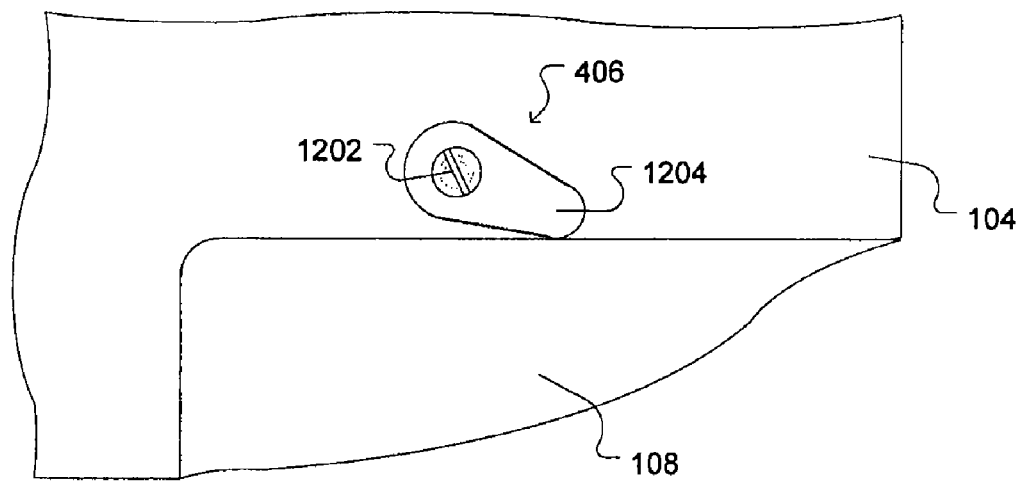
FIGS. 13A and 13B illustrate partial bottom views of the probe card assembly of FIG. 4 showing a cam assembly.
Figure 13B:
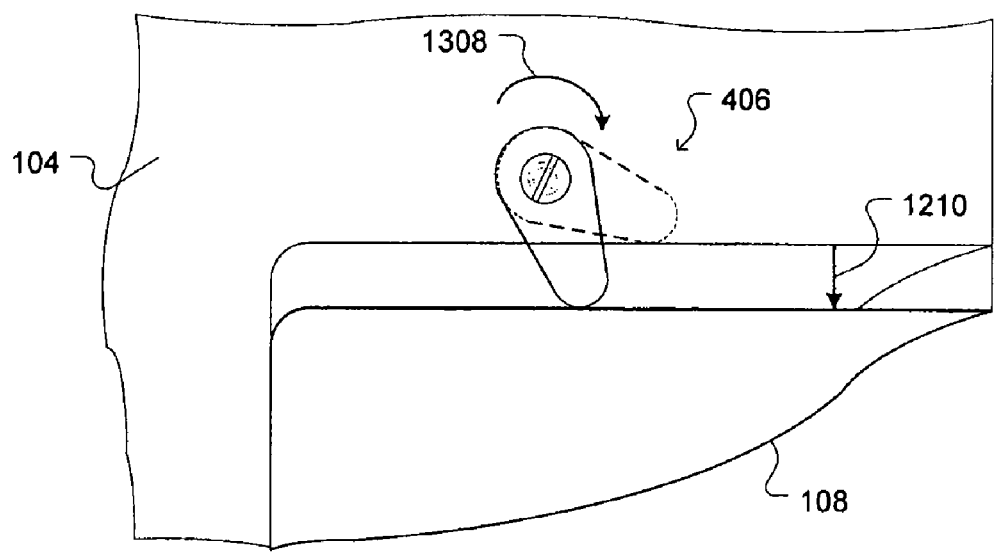

As mentioned above, the second adjustment mechanism 110 of FIGS. 2A and 3 is implemented in probe card assembly 400 of FIGS. 4-8 as a plurality of cam assemblies 406. FIG. 12A shows a side view and FIG. 13A shows a bottom view of one such cam assembly 406. As shown, a cam 1204 is firmly attached to a screw 1202, which is threaded into a threaded opening (not shown) in a post 1206. The post 1206 is firmly attached to the mounting assembly 104. Rotation of the screw 1202 rotates the cam 1204. As shown in FIGS. 12B and 13B, the cam 1204 abuts against the frame 410, and as the cam 1204 is rotated 1308 in one direction, the cam 1204 pushes against and moves 1210 the frame 410. As the cam 1204 is rotated in the opposite direction (not shown), the cam 1204 moves away from the frame 410, and the spring action of the spring assemblies 408 (which, as discussed above, bias the frame 410) pushes the frame 410 with the cam 1204.

As shown in FIGS. 4 and 6, eight cam assemblies 406 are positioned around each frame 410 (in FIG. 6, a frame 410 is hidden under each probe substrate 108). As shown in FIG. 14, the eight cam assemblies 408 bring eight forces 1404 to bear against a frame 410 (shown in block diagram form in FIG. 14), and by selective application of each of those eight forces 1404, the frame 410 (and thus the probe substrate 108 attached to the frame) can be translated along the "x" and "y" axes and rotated ($R_z$) about the "z" axis. Of course, however, fewer or more than eight cam assemblies 406 may be used to adjust one probe substrate 108. For example, a cam assembly 406 need not be located along every side of a probe substrate 108. For example, cam assemblies 408 may be located only on sides of a probe substrate 108 where the cam assemblies 408 oppose biasing directions of the spring assemblies 408.

Figure 15:
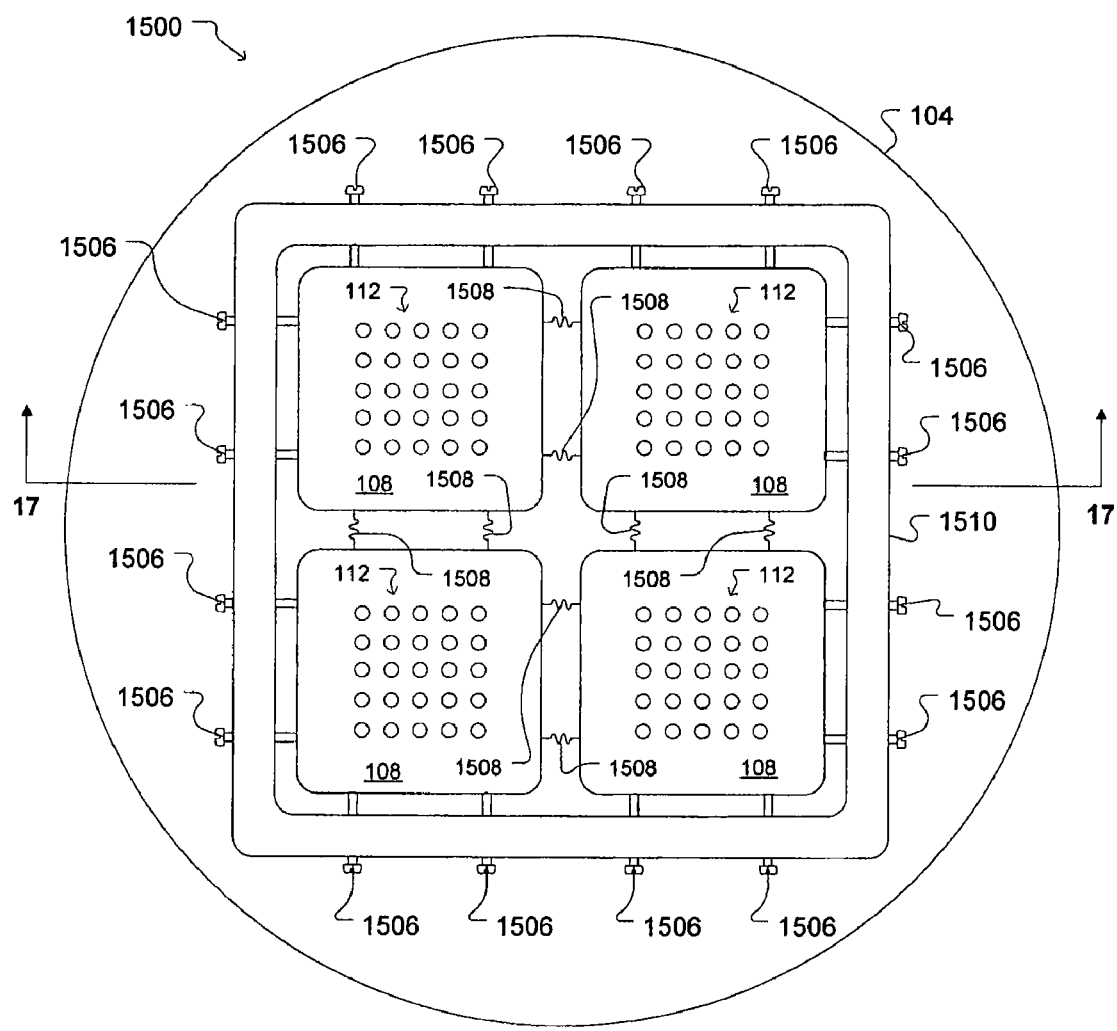
FIG. 15 illustrates a bottom view of yet another exemplary probe card assembly.
Figure 16:
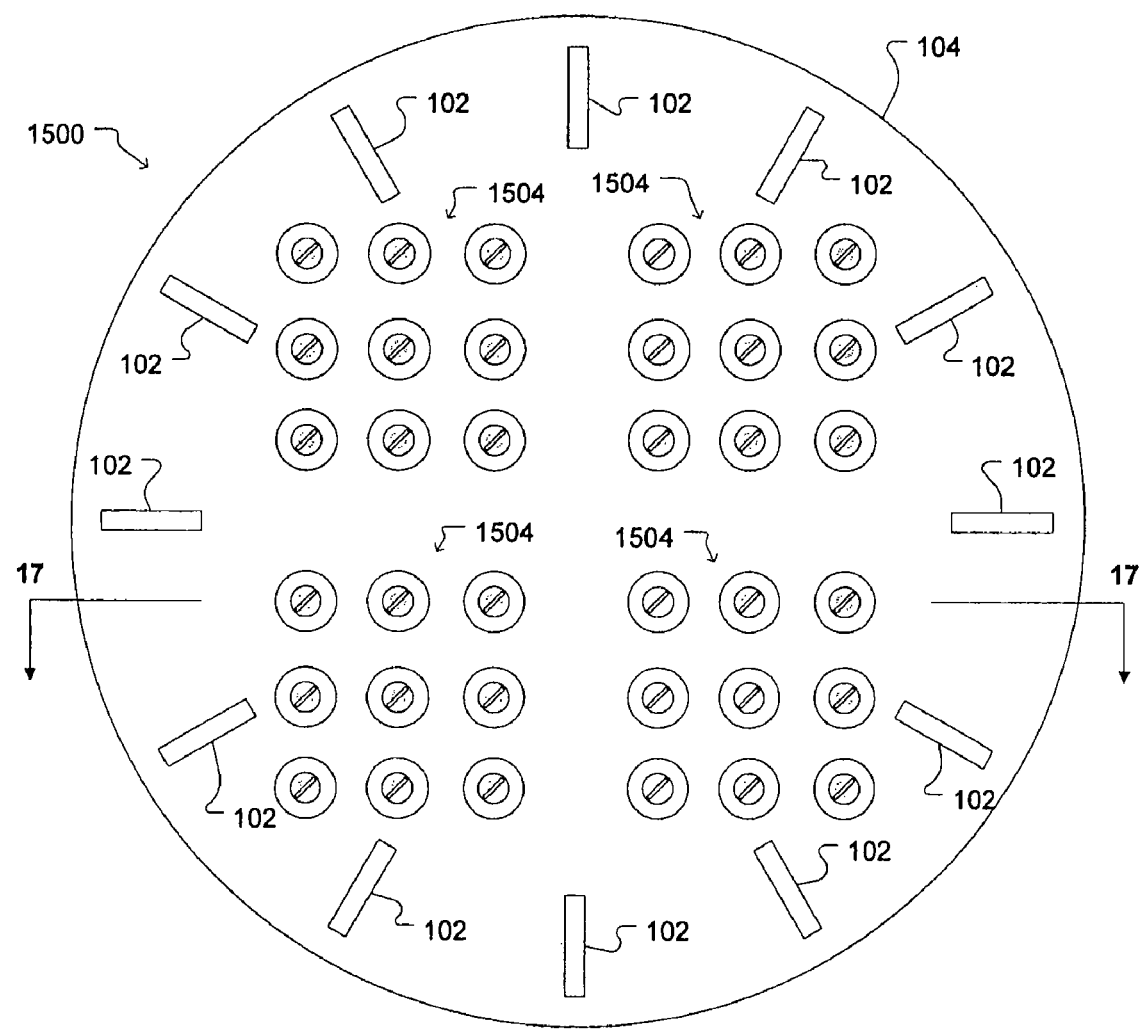
FIG. 16 illustrates a top view of the probe card assembly of FIG. 15.
Figure 17:
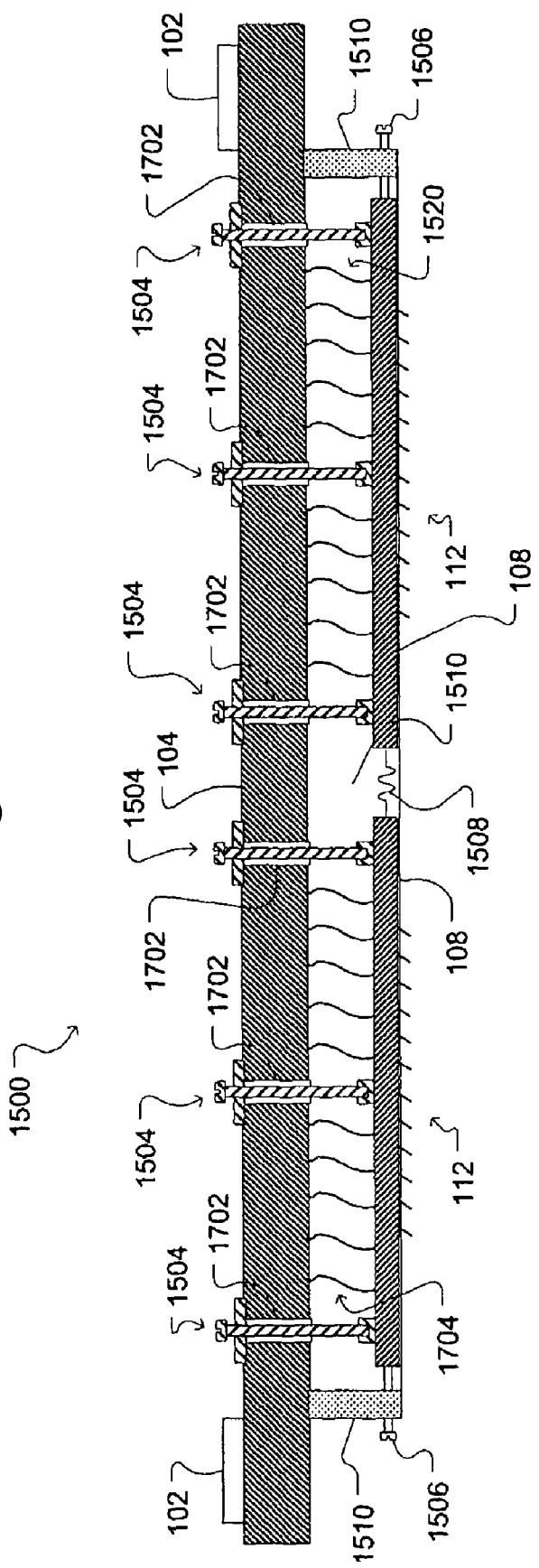
FIG. 17 illustrates a cross-sectional side view of the probe card assembly of FIG. 15.

FIGS. 15-17 illustrate another exemplary probe card assembly 1500. FIG. 15 shows a bottom view, FIG. 16 shows a top view, and FIG. 17 shows a side, cross-sectional view of the probe card assembly 1500. For ease of illustration, the depictions in FIG. 15-17 are not necessarily in proportion. For example, the probe substrates 108 may be spaced closer together but are depicted in FIGS. 15-17 for ease of illustration. Probe card assembly 1500 is, in some ways, similar to probe card assembly 400.

Like probe card assembly 400, probe card assembly 1500 may be used in a probing system. For example, probe card assembly 1500 may be used in place of the probe card assembly 20 in the probing system 90 of FIG. 1. In addition, the probe card assembly 1500 includes connectors 102 and a mounting assembly 104, which may be the same as like named and numbered elements in probe card assembly 400. Also, like probe card assembly 400, probe card assembly 1500 includes a plurality of probe substrates 108 (four are shown, although fewer or more may be used) arranged so that the probe sets 112 on each probe substrate 108 together form a large array of probes.

In the probe card assembly 1500, however, the attachment mechanism 114 of FIGS. 2A and 3 is implemented by leveling screw assemblies 1504. The first adjustment mechanism 106 of FIGS. 2A and 3 is also implemented by the leveling screw assemblies 1504, and the second adjustment mechanism 110 of FIGS. 2A and 3 is implemented by the leveling screw assemblies 1504 and set screws 1506 in bracket 1510. Exemplary spring assemblies 1508, which are shown in FIGS. 15 and 17, are in compression. Each spring assembly 1508 shown in FIG. 15 therefore biases the two probe substrates 108 to which the spring assembly 1508 is attached away from each other. Spring assemblies 1508 may be generally similar structurally to spring assemblies 408 in probe card assembly 400 but attached to between to probe substrates 108 rather than between frame 410 and mounting assembly 104.

Figure 18A:
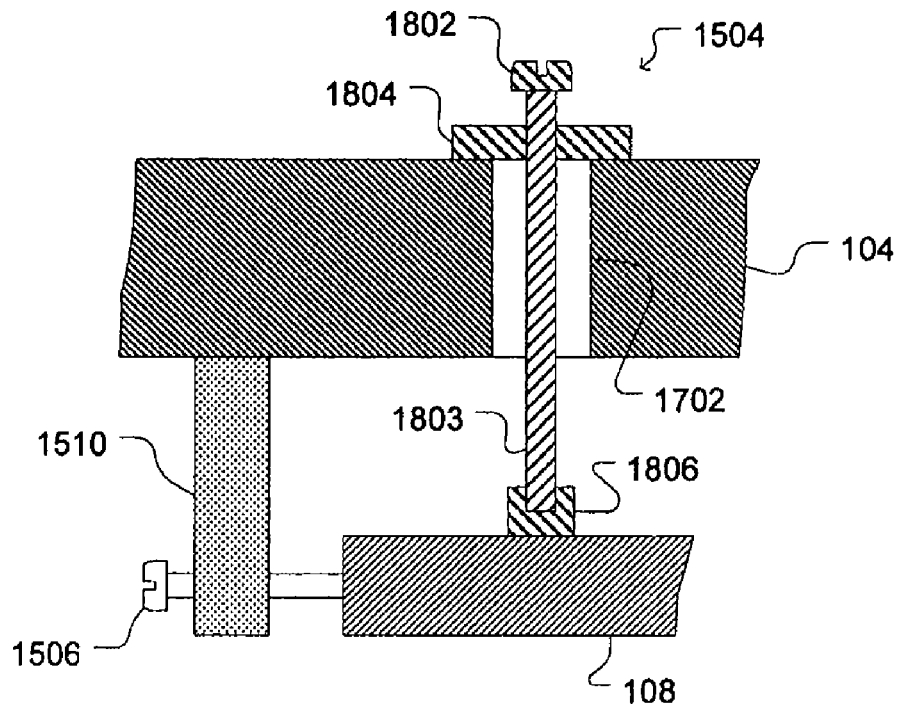
FIGS. 18A-18D illustrate partial cross-sectional side views of the probe card assembly of FIG. 15 showing a leveling screw assembly and a set screw.

As shown in particular in FIG. 17, the probe substrates 108 are attached to the mounting assembly 104 by leveling screw assemblies 1504, each of which extends through a passage 1702 in the mounting assembly 104. As illustrated in FIG. 18A, which shows a detailed view of the left-most leveling screw assembly 1504 in FIG. 17, each leveling screw assembly 1504 includes a screw 1802, a locking nut 1804, and a threaded stud 1806. The threaded stud 1806 is attached to a probe substrate 108. The method of attaching the threaded stud 1806 to the probe substrate 108 is not important, and any method may be used, including without limitation, any of the following methods: weld, braze, glue, adhesives, etc. The leveling screw assemblies 1504 attach the probe substrates 108 to the mounting assembly 104 and thus are another example of an attachment mechanism 114 of FIG. 2A.

Figure 18B:
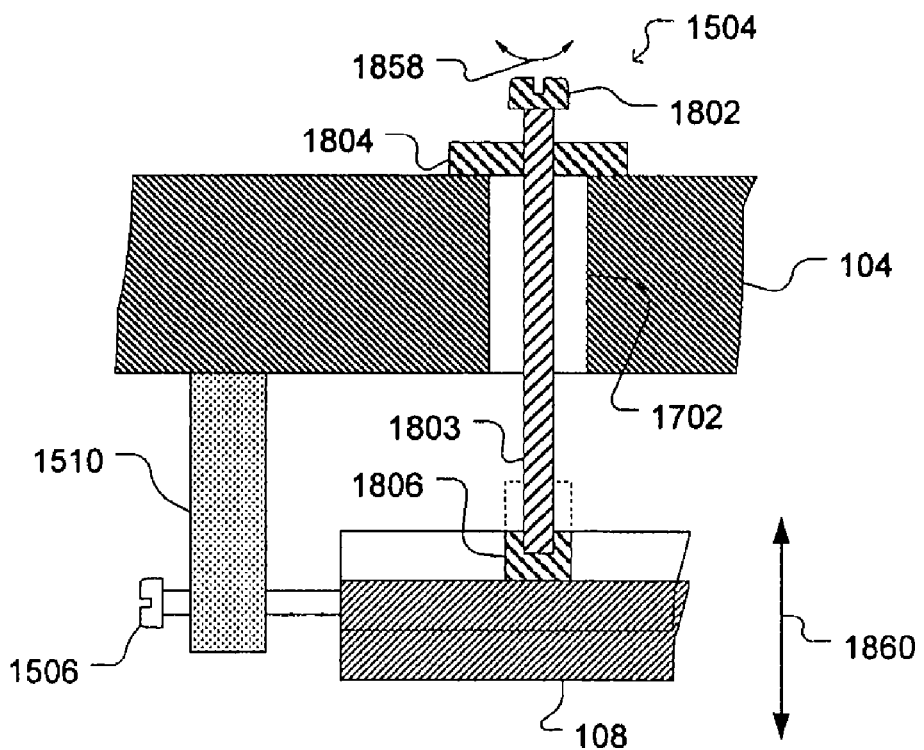

As shown in FIG. 18A, the shaft 1803 of the screw 1802 is threaded into a threaded hole (not shown) in stud 1806. As shown in FIG. 18B, as the screw 1802 is rotated 1858 in one direction, the screw 1802 retracts and exerts a pulling force on the stud 1806 and thus also on the probe substrate 108, which moves 1860 the probe substrate 108 towards the mounting assembly 104. As the screw 1802 is rotated 1858 in the opposite direction, the screw 1802 advances and exerts a pushing force on the stud 1806 and thus also on the probe substrate 108, which moves 1860 the probe substrate 108 away from the mounting assembly 104. The leveling screw assemblies 1504 thus move the probe substrate 108 to which they are attached vertically (relative to FIGS. 18A-18D). The leveling screws 1504 are thus also another example of the first adjusting mechanism 106 in FIG. 2A.

Figure 18C:
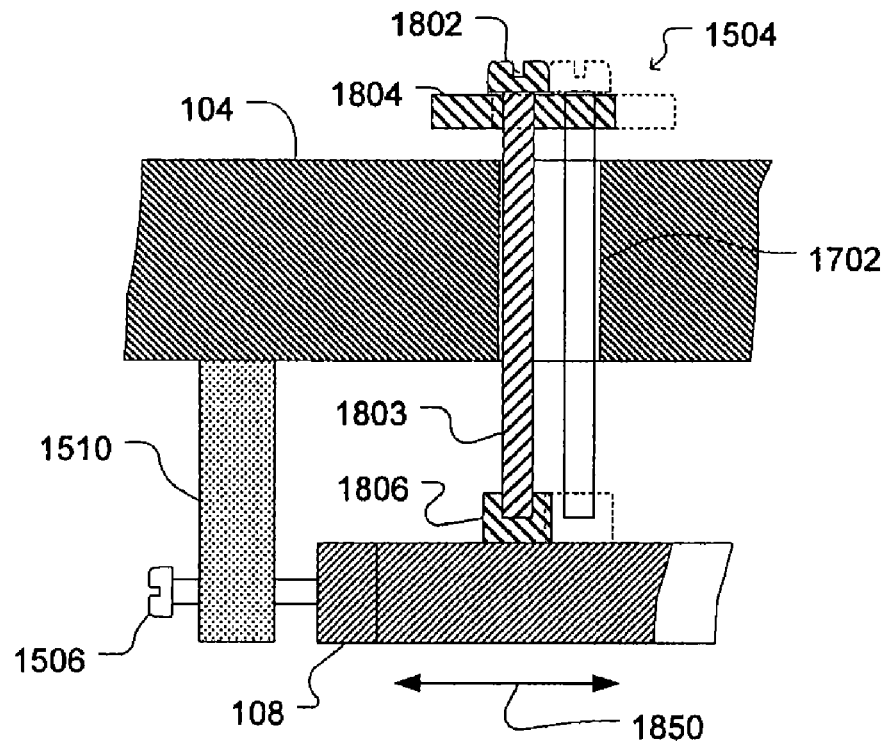

As shown in FIG. 18C, passages 1702 in the mounting assembly 104 are sufficiently large to allow the screw 1802 to move 1850 laterally in the passage 1702. While the locking nut 1804 is in a disengaged position (shown in FIG. 18C), the leveling screw assembly 1504 can be moved 1850 laterally (relative to FIGS. 18A-18D), which as shown in FIG. 18C, also moves 1850 the probe substrate 108 to which the threaded stud 1806 is attached. Passage 1702 is preferably configured so that lateral movement 1850 includes movement in any direction in the plane of the probe substrate 108 (e.g., the "x, y" plane shown in FIG. 2A.) While the locking nut 1804 is in an engaged position (shown in FIG. 18A), the leveling screw assembly 1504 is locked into position and cannot move 1850 laterally within passage 1702.

Figure 18D:
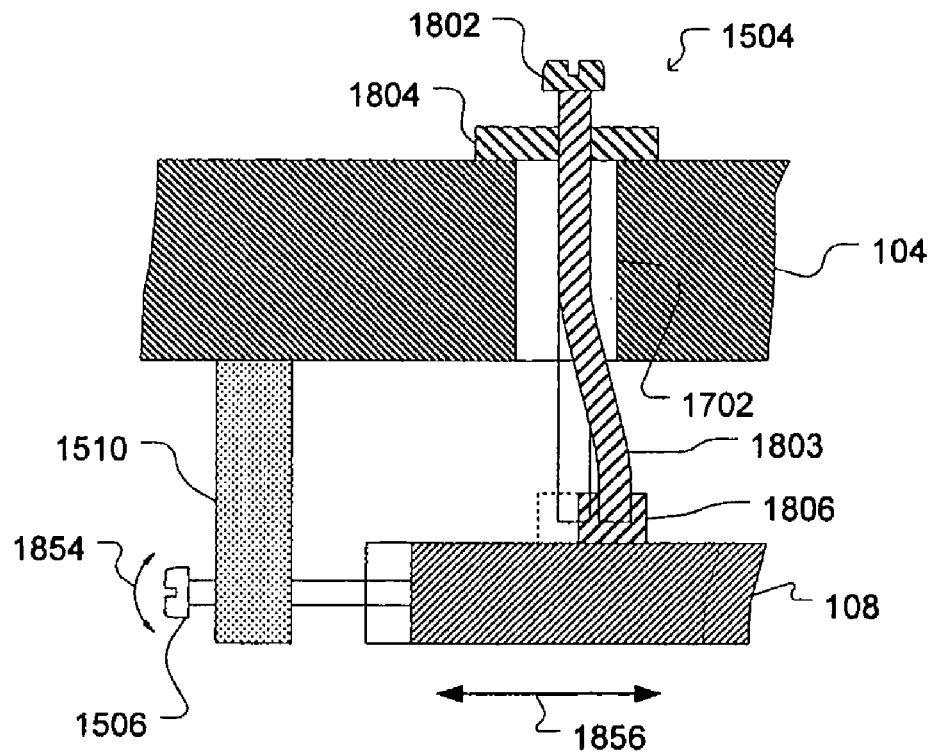

As shown in FIG. 18D, a set screw 1506 is threaded through a threaded hole (not shown) in a bracket 1510, which is attached to the mounting assembly using any suitable means (e.g., bolts, screws, clamps, glue, adhesives, etc.). Rotation 1854 of the set screw 1854 in one direction advances the screw 1854 towards the probe substrate 108, pushing 1856 the probe substrate laterally. Rotation 1854 of the screw 1854 in the opposite direction retracts the screw 1854 away from the probe substrate 108. Because of the biasing effects of springs 1508 (not shown in FIG. 18D), the probe substrate 108 moves with the set screw 1506 as the set screw is retracted. (As discussed above, the exemplary springs 1508 are preferably in compression and therefore, configured as shown in FIGS. 15 and 17, apply forces to a probe substrate 108 that are in opposition to forces-applied to the probe substrate 108 by the set screws 1506.) The shaft 1803 of screw 1802 preferably flexes, as shown in FIG. 18D, to allow movement of the probe substrate 108 while locking nut 1804 is locked, which as discussed above, prevents the leveling screw assembly 1504 from moving laterally within passage 1702. Alternatively, the shaft 1803 of the screw 1802 of in the leveling screw assembly 1504 may be resilient (i.e., spring like) so that the shaft 1803 exerts a counterforce on the probe substrate 108 in opposition to the force imparted by the set screw 1506 on the probe substrate 108. Such resilient shafts 1803 may also be configured to, during initial assembly of a probe card assembly 1500, bias the probe substrates 108 away from each other. If shafts 1803 are resilient, springs 1508 need not be used. As yet another alternative, springs 1506 and resilient shafts 1803 may both be used.

As discussed above, both the leveling screw assemblies 1504 and the set screw 1506 are able to effect lateral movement 1856 (relative to FIG. 18D) of the probe substrate 108. In a preferred embodiment, movement of the leveling screw assemblies 1504 within passages 1702 is for coarse lateral adjustment of the probe substrates 108, and the set screws 1506 are used for fine lateral adjustment of the probe substrates 108. The leveling screw assemblies 1504 and the set screws 1506 are thus another example of the second adjusting mechanism 110 in FIG. 2A.

Figure 19:
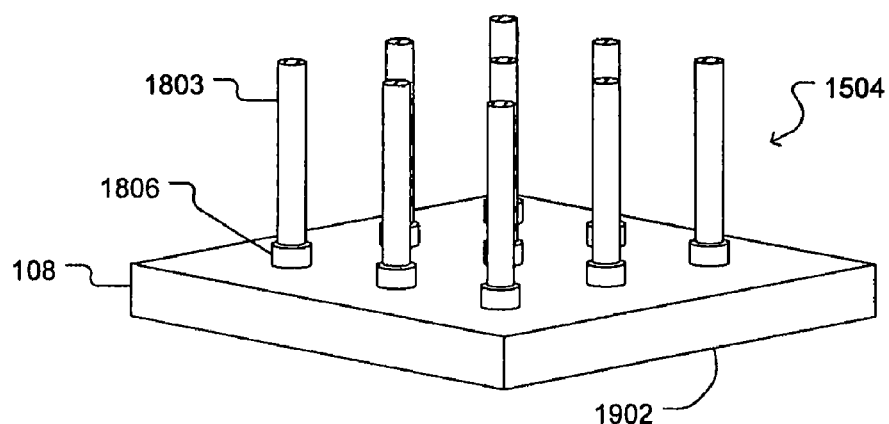
FIG. 19 shows a probe substrate of the probe card assembly of FIG. 15 with attached threaded studs and partial views of the screws threaded into the studs.
Figure 20:
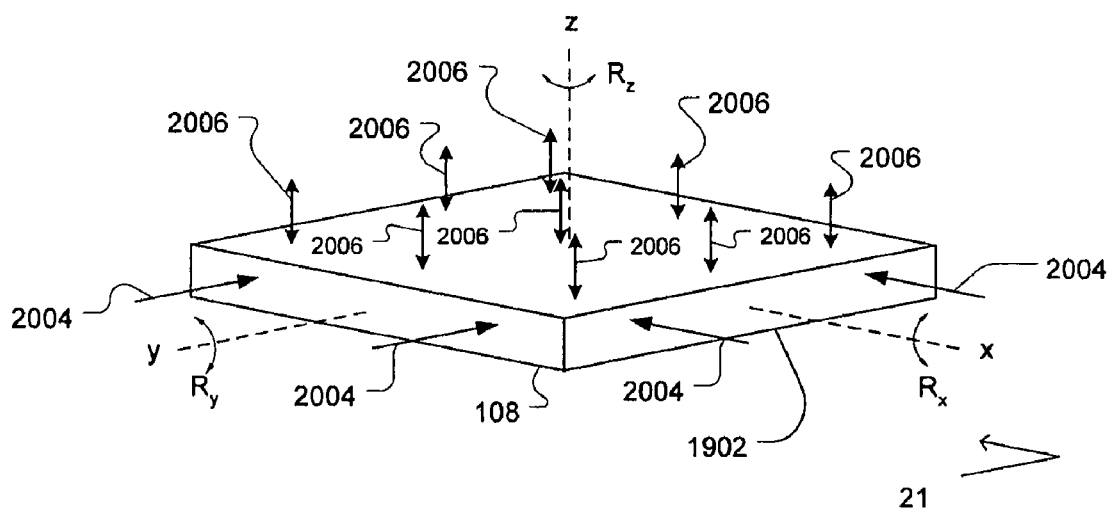
FIG. 20 shows forces that can be applied to a probe substrate of the probe card assembly of FIG. 15.
Figure 21:
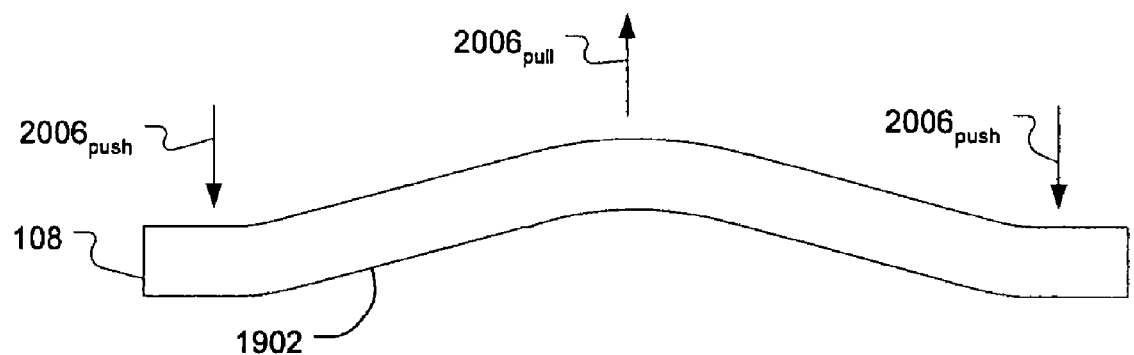
FIG. 21 shows exemplary push and pull forces that alter a shape of a probe substrate of the probe card assembly of FIG. 15.

As shown in FIG. 19, each exemplary probe substrate 108 has nine threaded studs 1806 into which are threaded nine shafts 1803 (shown in partial view in FIG. 19) of the screws 1802 of leveling screw assemblies 1504. (Of course, however, fewer or more than nine leveling screw assemblies 1504 may be used to adjust one probe substrate 108.) As shown in FIG. 20, the nine leveling screw assemblies 1504 bring nine forces 2006 to bear against a probe substrate 108, and by selective application of each of those nine forces 2006, the probe substrate 108 can be translated along the "z" axis and rotated ($R_x$, $R_y$) about both the "x" and "y" axes. As shown in FIG. 21, because the leveling screw assemblies 1504 can impart a push or a pull force to the probe substrate 108, the leveling screw assemblies 1504 are further able to change a shape of the probe substrate 108 and thus correct for such things as bending or bowing of the probe substrate 108. In FIG. 21, which shows a side view of FIG. 20, alternating push and pull forces are applied to the probe substrate 108, which changes the shape of the surface 1902 of the probe substrate 108 to which the probes (not shown in FIG. 21) are attached. The degree by which the shape of surface 1902 is altered in FIG. 21 is exaggerated for purposes of illustration. Typically, the surface 1902 is altered only slightly to compensate for minor imperfections in the planarity of the surface 1902 or the die terminals 22 (see FIG. 1). The aforementioned U.S. Pat. No. 6,509,751 discloses and discusses examples in which the shape of a probe substrate is altered.

As best seen in FIG. 15, four set screws 1506 are positioned around each probe substrate 108 in the probe card assembly 1500. As shown in FIG. 20, the four set screws 1506 bring four forces 2004 to bear against a probe substrate 108, and by selective application of each of those four forces 2004 (and selective lateral movement of leveling screw assemblies 1504 as shown in FIG. 18C), the probe substrate 108 can be translated along the "x" and "y" axes and rotated ($R_z$) about the "z" axis. Of course, however, fewer or more than four set screws 1506 may be used to adjust one probe substrate 108.

Referring again to FIG. 17, wires 1704 provide electrical paths 154 (see FIG. 2B) between the mounting assembly 104 and the probe substrates 108. Each wire 1704 may be attached (e.g., soldered) at one end to a conductive terminal (not shown) on the mounting assembly 104 and at the other end to a conductive terminal (not shown) on a probe substrate 108. The wires 1704 may be flexible to accommodate movement of the probe substrates 108.

Figure 22A:
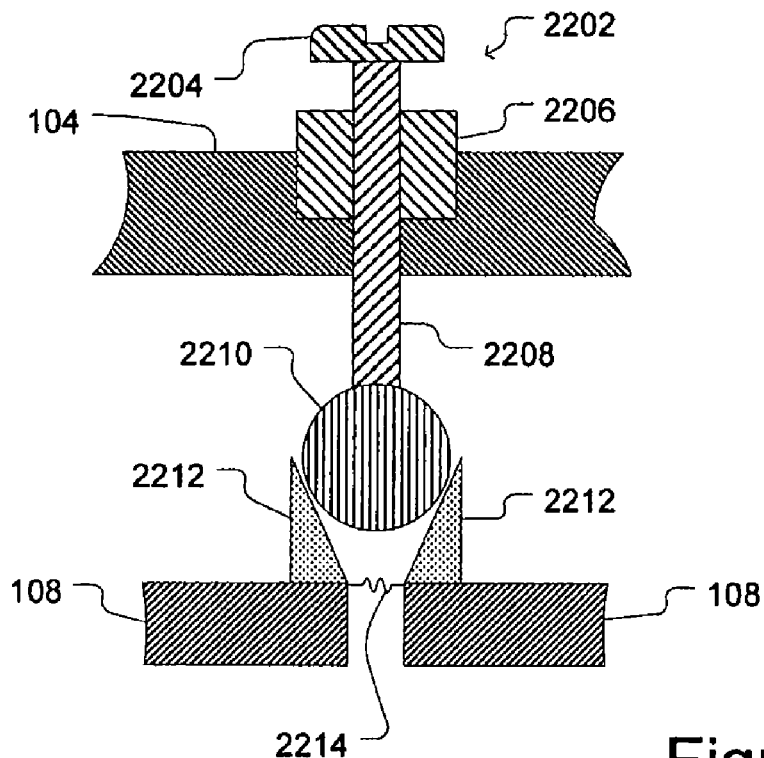
FIGS. 22A and 22B illustrate an exemplary lateral adjustment mechanism that may be used with the probe card assembly of FIG. 15.

FIG. 22A illustrates an exemplary lateral adjustment assembly 2202 that may be used in place of the cam assemblies 406 of probe card assembly 400 or the set screws 1506 in probe card assembly 1500. As shown, the assembly 2202 includes a differential screw structure comprising a threaded screw 2204 whose shaft 2208 threads through a threaded hole (not shown) in an outer element 2206 that is embedded, attached to, integrally formed with, or otherwise secured to the mounting assembly 104. The shaft 2208 presses against a sphere 2210 disposed between receiving structures 2212 disposed on adjacent probe substrates 108. A spring 2214 exerts forces that tend to pull the probe substrates together (e.g., spring 2214 is in tension).

Figure 22B:
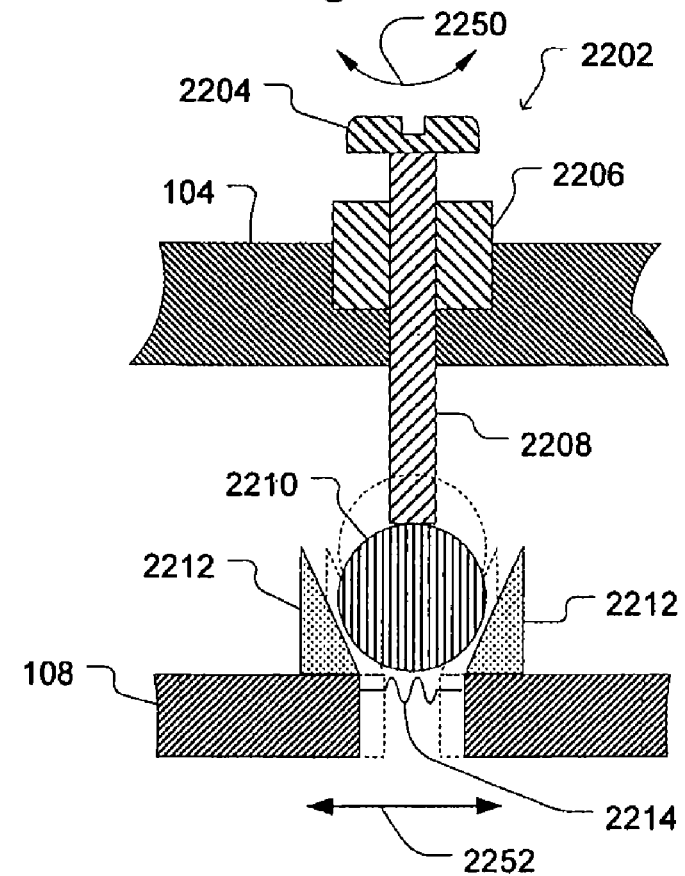

As shown in FIG. 22B, as the screw 2204 is rotated 2250 in one direction, the shaft 2208 advances, pushing the sphere 2210 towards the probe substrates 108 and moving 2252 the probe substrates 108 apart laterally. As the screw 2204 is rotated 2250 in the opposite direction, shaft 2208 retracts away from the sphere 2210, and spring 2214 pulls the probe substrates, 108 towards each other.

Figure 23:
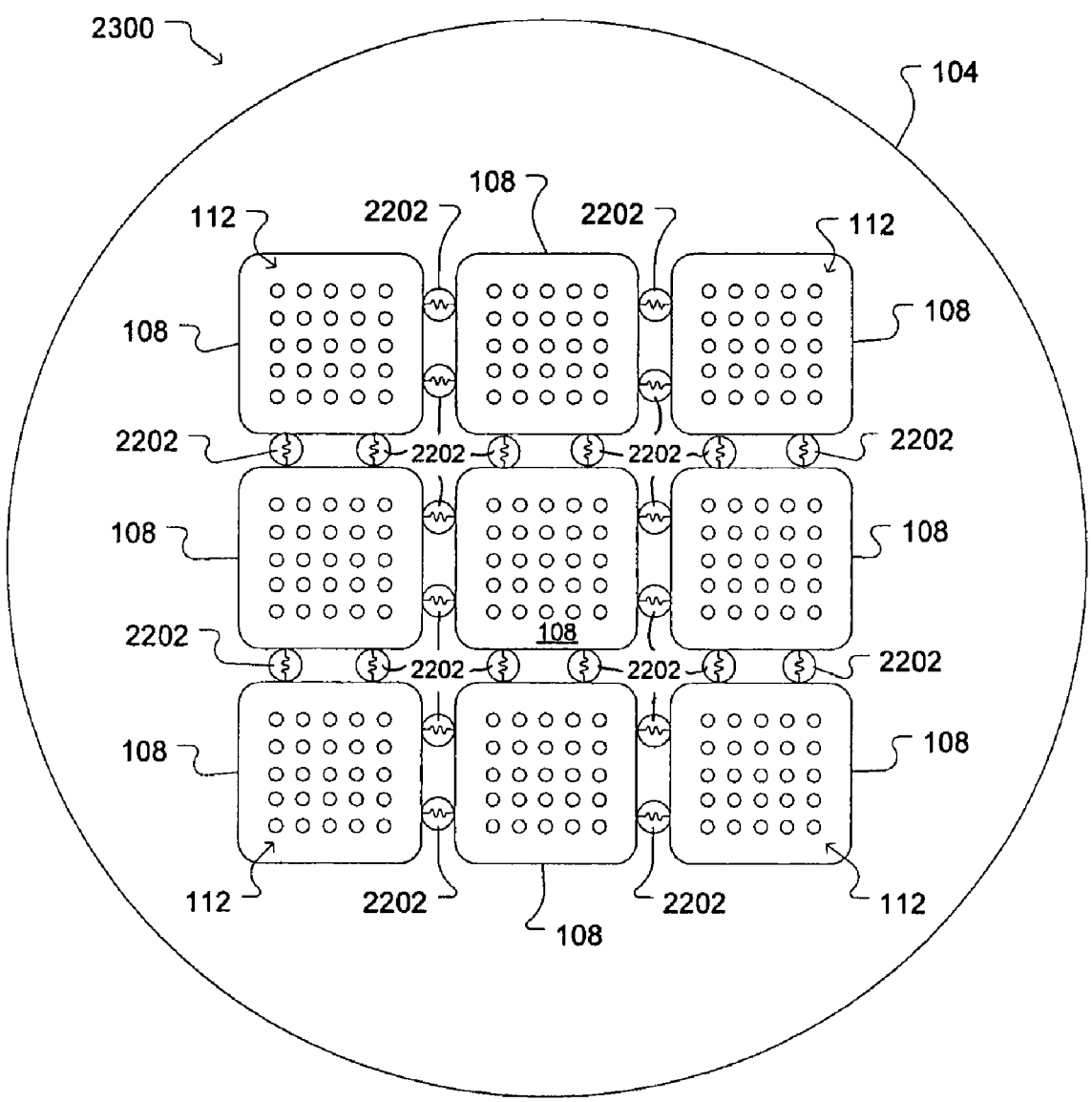
FIG. 23 illustrates a bottom view of still another exemplary probe card assembly.

The lateral adjustment assembly 2202 shown in FIG. 22A is thus another example of the second adjustment mechanism 110 of FIGS. 2A and 3. The lateral adjustment assembly 2202 of FIG. 22A may be particularly useful in a probe card assembly in which at least one of the probe substrates 108 is surrounded by other probe substrates 108. An example of such a probe card assembly 2300 is shown in FIG. 23 (which shows a bottom view of the probe card assembly 2300). As shown, the probe card assembly 2300 includes nine probe substrates 108, each with a probe set 112. Because the middle probe substrate 108 is surrounded by other probe substrates 108, the use of adjustment assemblies 2202, whose adjustment mechanism (screw 2204) is accessible from the other side of the mounting assembly 104, may be more convenient than assemblies whose adjustment mechanisms are located lateral to the probe substrates (e.g., the set screws 1506 in probe card assembly 1500). (For ease of illustration, the depiction in FIG. 23 is not necessarily in proportion. For example, the probe substrates 108 may be spaced closer together but are depicted in FIG. 23 for ease of illustration.)

Figure 24:
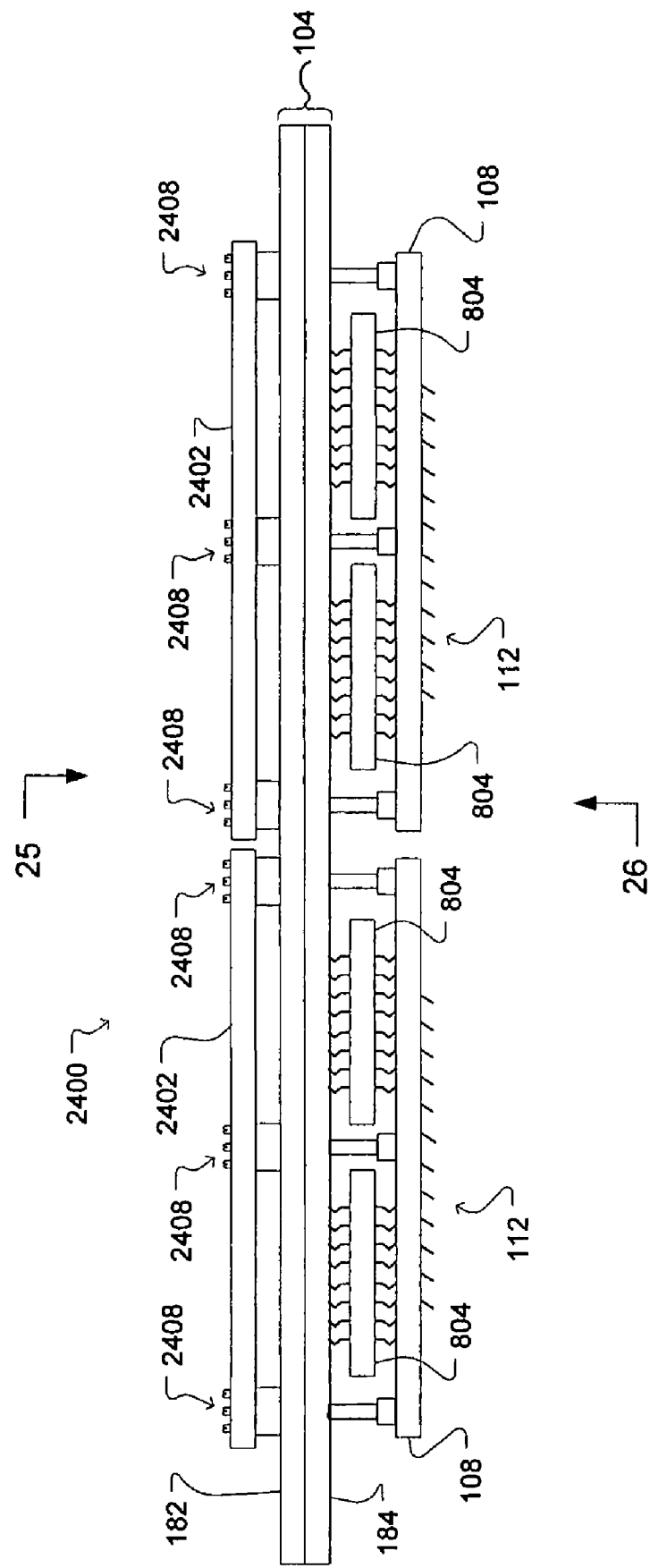
FIG. 24 shows a side view of yet another exemplary probe card assembly.
Figure 25:
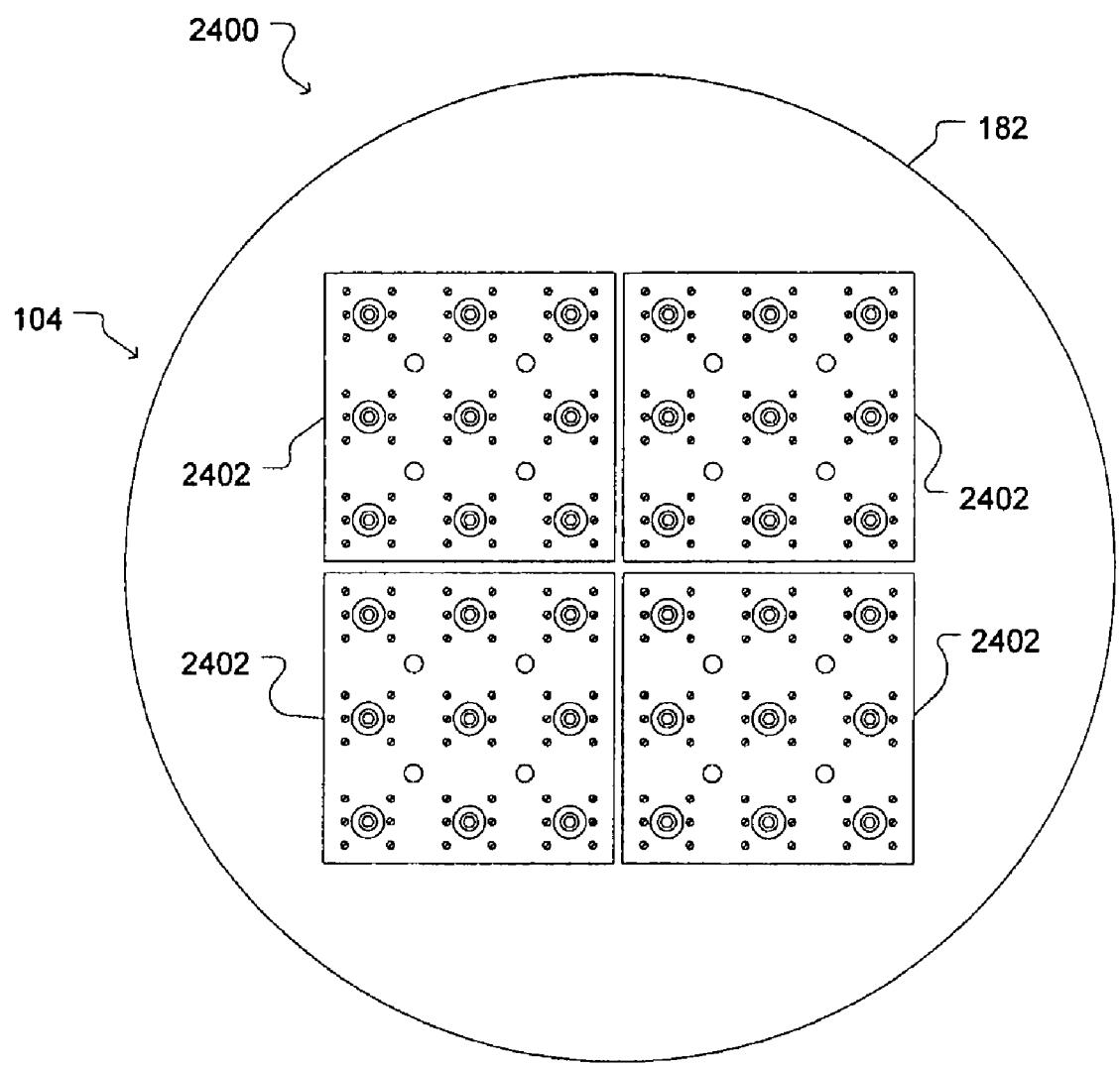
FIG. 25 shows a top view of the probe card assembly of FIG. 24.
Figure 26:
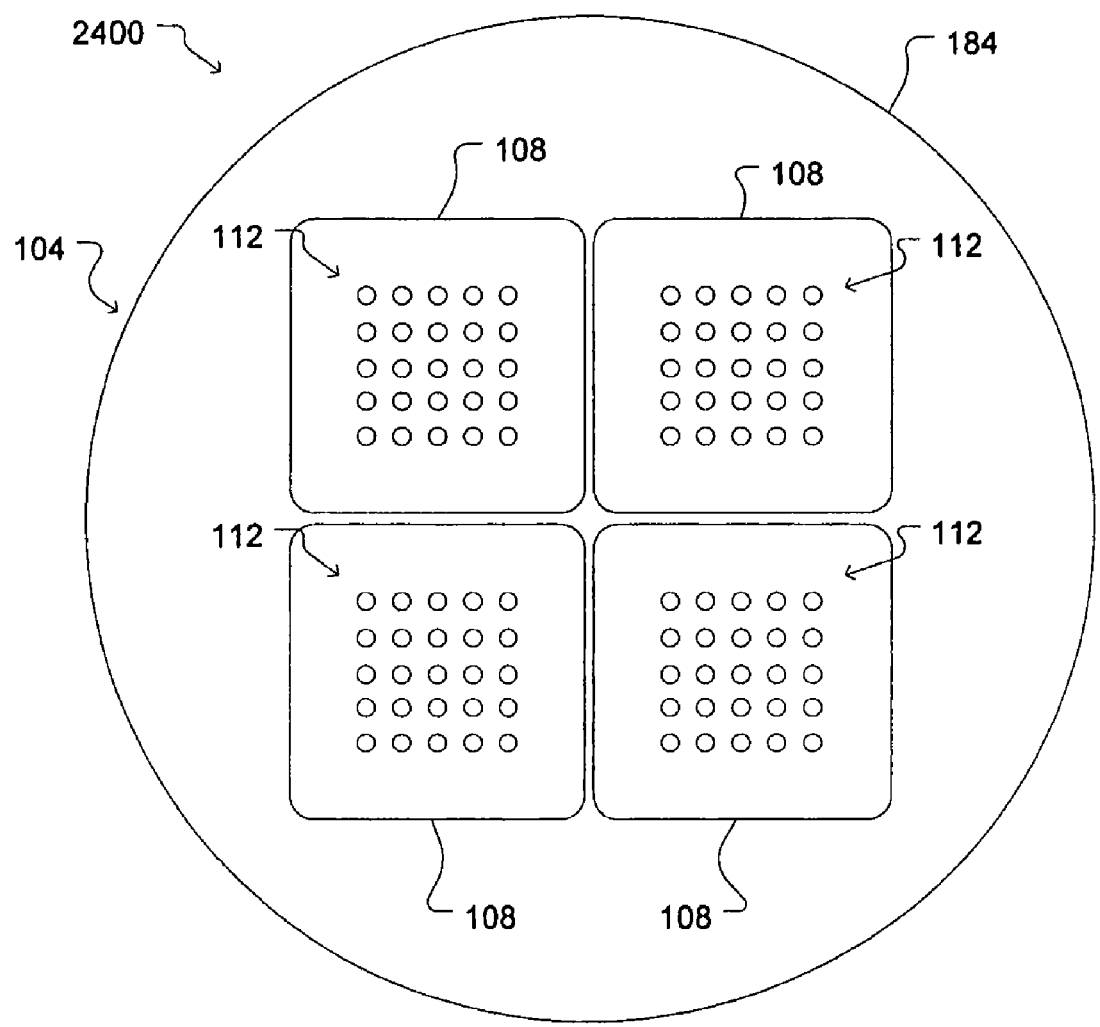
FIG. 26 shows a bottom view of the probe card assembly of FIG. 24.

FIGS. 24-26 illustrate yet another exemplary probe card assembly 2400. FIG. 24 shows a side view, FIG. 25 shows a top view, and FIG. 26 shows a bottom view of the probe card assembly 2400. For ease of illustration, the depictions in FIG. 24-26 are not necessarily in proportion.

Probe card assembly 2400 is, in some ways, similar to probe card assembly 1500. Like probe card assembly 1500, probe card assembly 2400 may be used in a probing system. For example, probe card assembly 2400 may be used in place of the probe card assembly 20 in the probing system 90 of FIG. 1. In addition, the probe card assembly 2400 includes connectors (not shown but similar to connectors 102 in probe card assembly 1500) and a mounting assembly 104, which may be the same as the mounting assembly 104 in probe card assembly 1500. A shown in FIG. 24, the mounting assembly 104 preferably includes a stiffener plate 182 and a wiring board 184 as shown in and discussed with respect to FIG. 2C. Also, like probe card assembly 1500, probe card assembly 2400 includes a plurality of probe substrates 108 (four are shown, although fewer or more may be used) arranged so that the probe sets 112 on each probe substrate 108 together form a large array of probes. Like probe card assembly 400 of FIGS. 4-6, probe card assembly 2400 includes interposers 804 (each comprising spring contact elements 806 and 810 and an interposer substrate 806 as shown in FIG. 8) for providing flexible and/or resilient electrical connections between the wiring substrate 184 and the probe substrates 108, as discussed above with respect to FIG. 8. Interposers 804 may, alternatively, be replaced with other flexible electrical connections such as the flexible wires 1704 shown in FIG. 17.

In the probe card assembly 2400, however, the attachment mechanism 114, first adjustment mechanism 106, and second adjustment mechanism 110 of FIGS. 2A and 3 are implemented by alignment plates 2402 and alignment/planarization ("AP") assemblies 2408. As shown, in probe card assembly 2400, there is one alignment plate 2402 for each probe substrate 108, and there are nine AP assemblies 2408 per alignment plate 2402. Of course, however, more or fewer alignment plates 2402 per probe substrate 108 and AP assemblies 2408 per alignment plate 2402 may be used.

Figure 27:
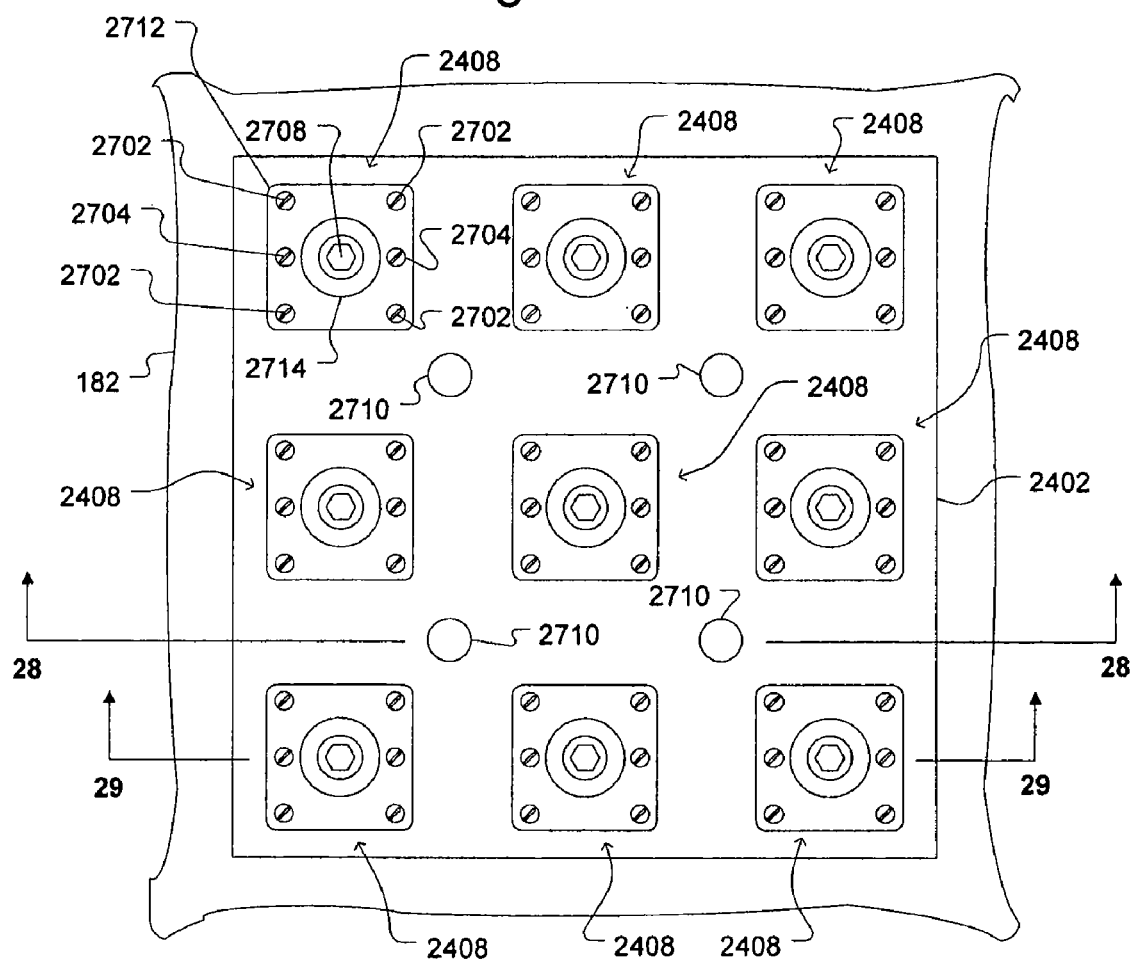
FIG. 27 shows a partial view from FIG. 25 showing one alignment plate.
Figure 28:
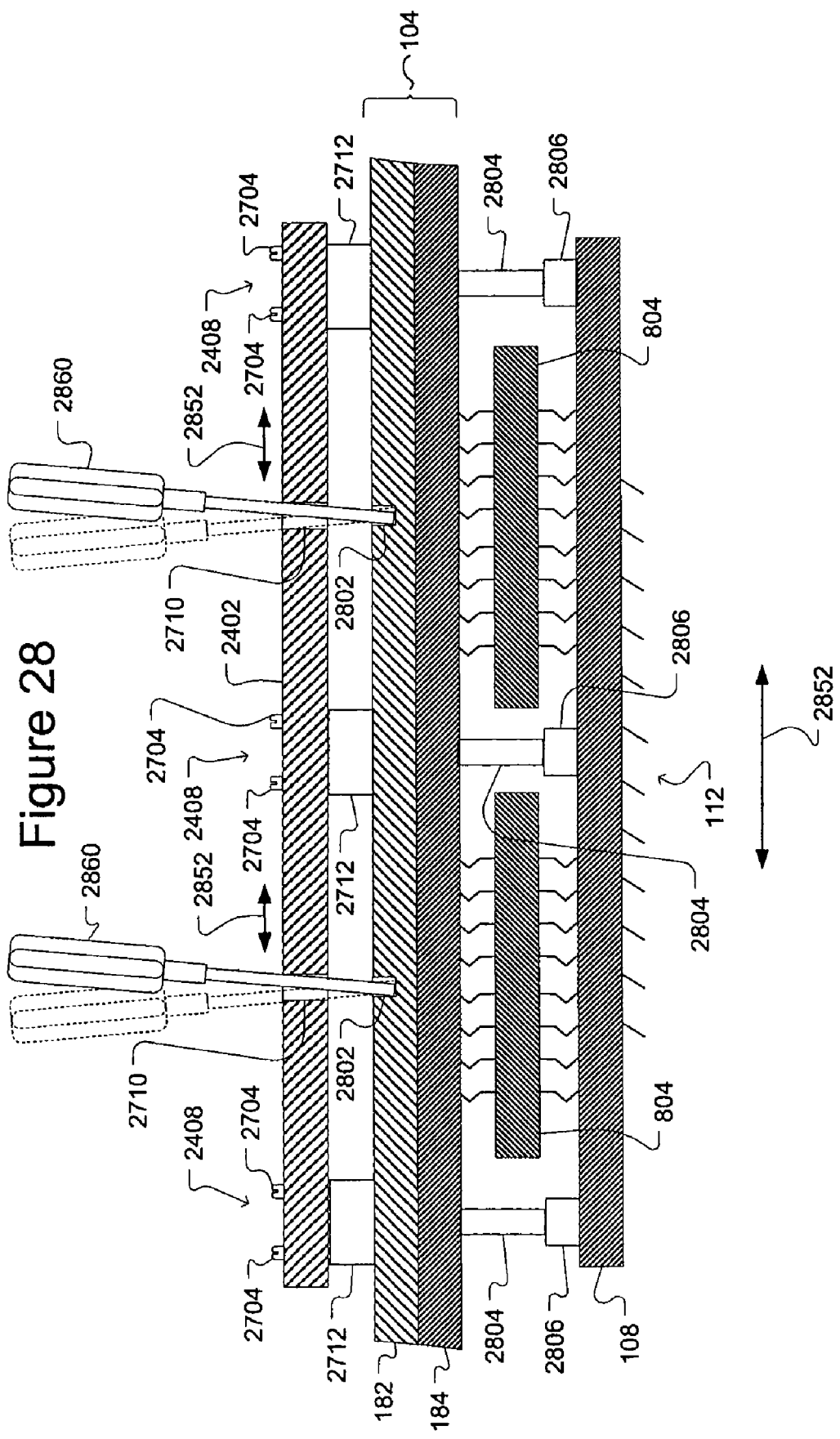
FIGS. 28 and 29 show cross-section side views from FIG. 27.
Figure 29:
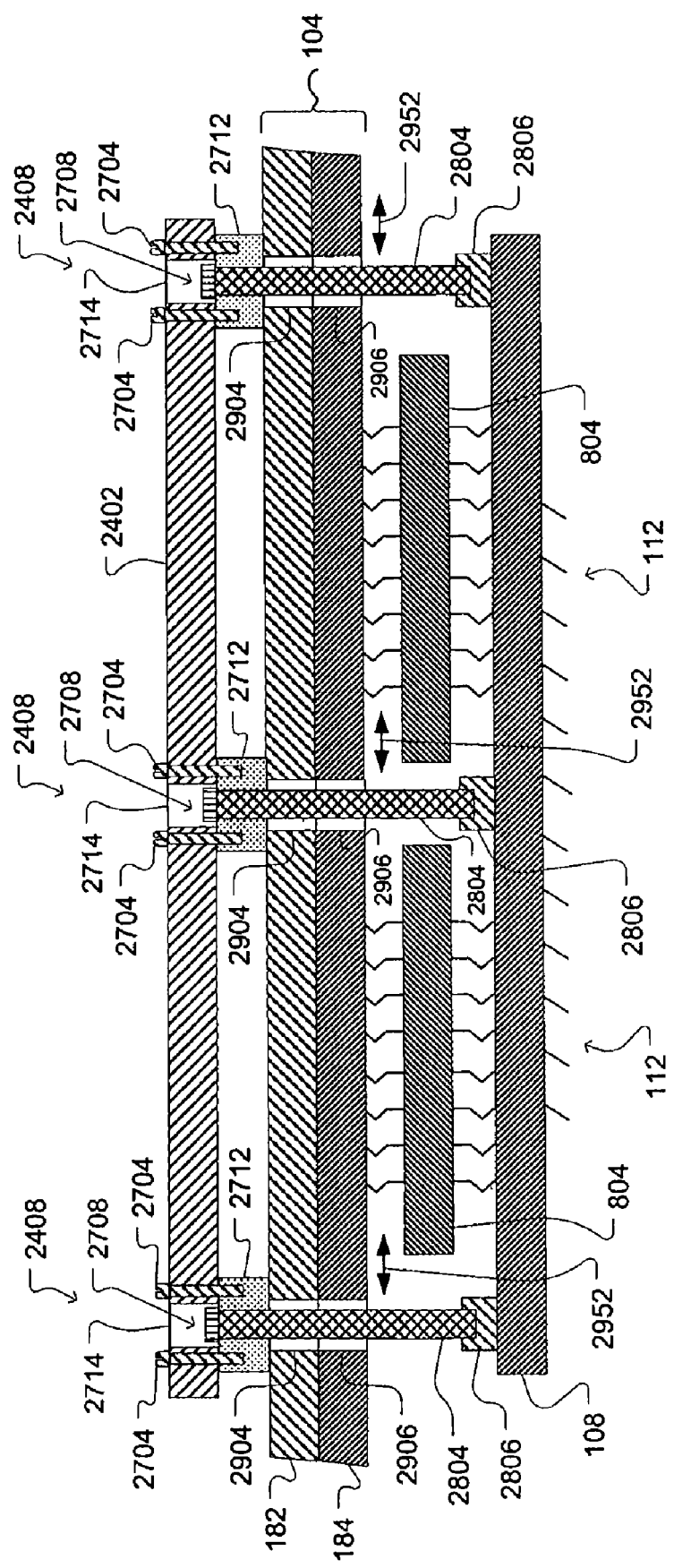

FIGS. 27-29 show a detailed illustration of one of the four alignment plates 2402. FIG. 27, which is a partial view of FIG. 25, shows a top view of one alignment plate 2402, and FIGS. 28 and 29 show side, cross-sectional views of the alignment plate 2402 of FIG. 27. All four of the alignment plates 2402 of probe card assembly 2400 may be similarly configured.

The alignment plate 2402, which may be a metallic substrate, includes openings 2714 for accessing each AP assembly 2408 and tool passages 2710. (Although four tool passages 2710 are shown, fewer or more may be used.) As shown, in FIG. 27, nine AP assemblies 2408 are attached to an alignment plate 2402. (As stated above, more of fewer than nine AP assemblies 2408 may be used.)

As best seen in FIG. 29, each AP assembly 2408 comprises a housing 2712 and a differential screw assembly 2708 that includes a stud extender 2804 that threads into a stud 2806 attached to a probe substrate 108. The differential screw assemblies 2708 are preferably of a split-nut configuration. The differential screw assemblies 2708 may function generally like the leveling screw assemblies 1504 of probe card assembly 1500. That is, like leveling screw assemblies 1504, differential screw assemblies 2708 can exert a pushing or pulling force on the threaded stud 2806. Similar to the movement shown in FIG. 18B, rotation of the differential screw assembly 2708 in one direction pulls the stud 2806 (and thus the probe substrate 108) towards the mounting assembly 104, and rotation of the differential screw assembly 2708 in the opposite direction pushes the stud 2806 (and thus the probe substrate 108) away from the mounting assembly 104. Split-nut differential screws that provide for fine adjustments on the order of 10 microns or less, and such precise split-nut differential screws may be used. A tool (not shown) may engage the differential screw assemblies 2708 through openings 2714.

As also best seen in FIG. 29, the housing 2712 is located between the alignment plate 2402 and the stiffener plate 182 of the mounting assembly 104. (The housing 2712 is located behind the alignment plate 2402 and thus out of view in FIG. 27. Nevertheless, for ease of illustration, the housing 2712 is included in FIG. 27 but is shown in dashed lines.) The housing 2712 is immovably attached to the alignment plate 2402 by attachment screws 2704. Brake screws 2702 (visible only in FIG. 27), however, determine whether the housing 2712 is movable with respect to the stiffener plate 182. While brake screws 2702 are loose, the housing 2712 is movable laterally (with respect to FIGS. 29 and 30) with respect to the stiffener plate 182. The differential screw 2708, including its stud extender 2806, of each AP assembly 2408 along with stud 2806 move 2952 with the housing 2712. Passages 2904 and 2906 in the stiffener plate 182 and wiring substrate 184, respectively, allow the stud extender 2804 to move with respect to the stiffener plate 182 and wiring board 184. While brake screws 2702 are tightened, however, the housing 2712 and thus the entire AP assembly 2408 is locked in place and cannot move with respect to the stiffener plate 182. The brake screws 2702 thus function like the locking nut 1804 of differential screw assemblies 1504 of probe assembly 1500 and allow for lateral movement like movement 1850 shown in FIG. 18C.

As shown in FIG. 28, two or more leverage tools 2860 (e.g., screw drivers) may be inserted through tool passages 2710 in the alignment plate 2402 and into openings 2802 in the stiffener plate 182. The leverage tools 2860 may then be used as levers to apply lateral (with respect to FIGS. 28 and 29) forces to the alignment plate 2402. Because the housings 2712 of the AP assemblies 2408 are firmly attached by attachment screws 2704 to the alignment plate 2402, those forces will move 2852 not only the alignment plate 2402 with respect to the stiffener plate 182, but will also move each of the housings 2712, which in turn moves 2854 the probe substrate 108 to which the studs 2806 of the AP assemblies 2408 are attached. Of course, the housings 2712 and probe substrate 108 move only if the brake screws 2702 of each housing 2712 are loose. If the brake screws 2702 are tightened, the housings 2712 do not move.

Figure 30:
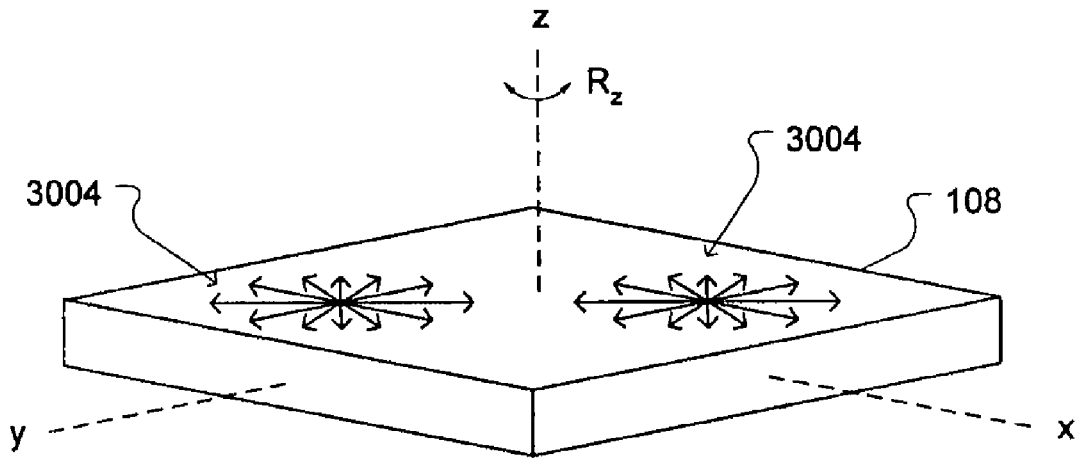
FIG. 30 shows forces that can be applied to a probe substrate of the probe card assembly of FIG. 24.

The alignment plates 2402 and AP assemblies 2408 are thus able to adjust the planarity and/or alignment of each probe substrate 108 in probe card assembly 2400 in six different degrees of movement and alter the shape of the probe substrate 108. That is, as shown in FIG. 30, two leverage tools 2860 inserted in two pairs of tool passages 2710 through alignment plate 2402 and holes 2802 in the stiffener plate 182 (see FIG. 28) can exert lateral forces 3004 in any direction in the "x, y" plane, and those forces 3004 cause the probe substrate 108 to be translated along the "x" and/or "y" axes and/or to be rotated ($R_z$) about the "z" axis. Moreover, because the nine AP assemblies 2408 are able to apply push and/or pull forces to a probe substrate 108, the nine AP assemblies 2408 are able to bring the same nine push or pull forces 2006 shown in FIG. 20 to bear on a probe substrate 108. As shown in FIG. 20, by selective application of those nine forces 2006, the probe substrate 108 can be translated along the "z" axis and rotated ($R_x$, $R_y$) about both the "x" and "y" axes. In addition to those six degrees of movement—translation along the "x,", "y," and "z" axes and rotation ($R_x$, $R_y$, $R_z$) about each of those axes—as shown in FIG. 21, by applying alternating push and pull forces to the probe substrate 108, the shape of the probe substrate 108 can changed.

Figure 31:
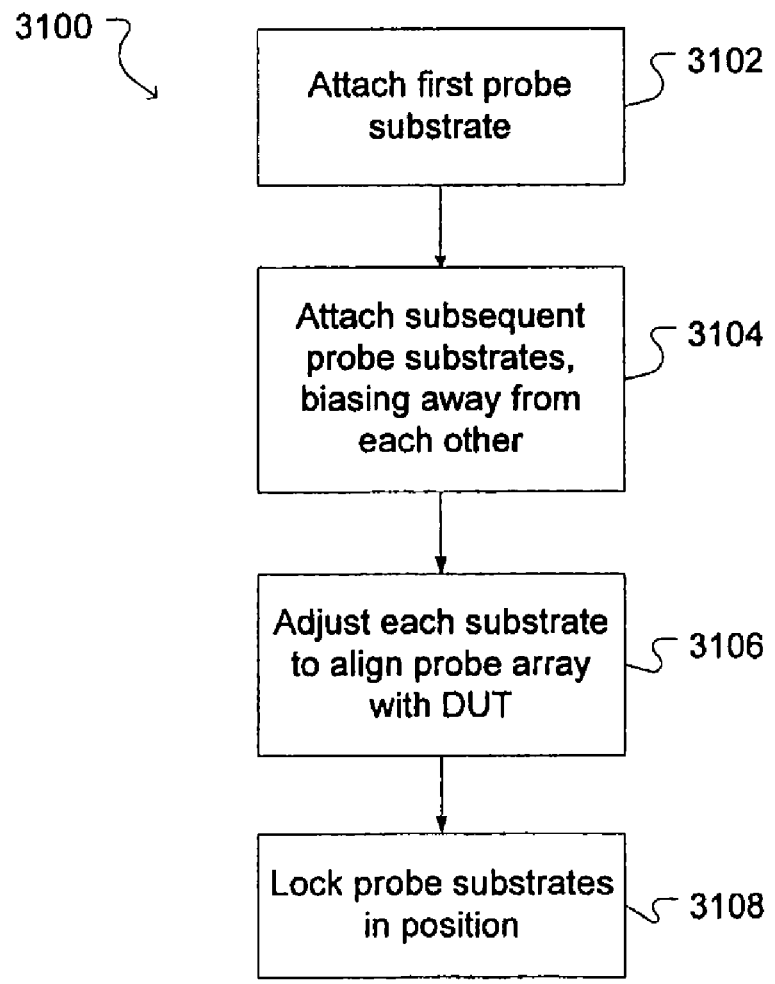
FIG. 31 illustrates an exemplary process for making a probe card assembly with multiple probe substrates.

FIG. 31 illustrates an exemplary process 3100 for making a probe card assembly (e.g., 100, 400, 1500, 2300, 2400) in which the probe array for contacting the device to be tested is made up of a plurality of probe sets (e.g., 112) each disposed on a separate probe substrate (e.g., 108).

At step 3102, a first probe substrate 108 comprising a first set of probes 112 is attached to a mounting assembly 104. For example, the lower right probe substrate 108 shown in FIG. 3 may be attached to the mounting assembly 104. At step 3104, additional probe substrates 108 are attached to the mounting assembly 104. For example, the upper right, upper left, and lower left probe substrates 108 in FIG. 3 may be attached to the mounting assembly 104. The probe substrates 108 attached to the mounting assembly 104 at steps 3102 and 3104 may be attached using any of the techniques and mechanisms discussed above so that each probe substrate 108 can be adjusted (e.g., planarized and aligned) as described herein. For example, each probe substrate 108 may be attached to the mounting assembly 104 using the spring assemblies 408 of probe card assembly 400, the leveling screw assemblies 1504 of probe card assembly 1500, or the AP assemblies 2408 of probe card assembly 2400.

As noted in step 3104, as each probe substrate 108 is attached to the mounting assembly 104, the probe substrate 108 may be biased away from others of the probe substrates 108. For example, the first probe substrate 108 attached to the mounting assembly 104 at step 3102 may not be biased in any direction, and the probe substrates 108 subsequently attached to the mounting assembly at step 3104 may be biased away from the first. Alternatively, all of the probe substrates 108 attached at steps 3102 and 3104 may be biased away from each other. As yet another alternative, the probe substrates 108 need not be biased. If one or more of the probe substrates 108 is biased, spring assemblies 408 of probe card assembly 400, spring assembly 1508 of probe card assembly 1500, or spring 2214 of probe card assembly 2300 may be used to do so.

At step 3106, the alignment and/or planarity of one or more of the probe substrates 108 attached at steps 3102 and 3104 are adjusted to align and/or planarize the probe array (comprised of the probe sets 112 on each probe substrate 108). As described above, first adjustment mechanisms 106 and second adjustment mechanisms 110 of FIGS. 2A and 3 may be used to move one or more of the probe substrates 108 along the "x," "y," and/or "z" axes and/or rotate ($R_x$, $R_y$, $R_z$) the probe substrates 108 about the "x," "y," and/or "z" axes, as shown in FIG. 2A and discussed above. For example, the differential screw assemblies 404 and cam assemblies 406 of probe card assembly 400 may be used to impart the forces and movements shown in FIG. 14 to one or more of the probe substrates 108 attached to the mounting assembly 104 at steps 3102 and 3104. As another example, the leveling screw assemblies 1504 and set screws 1506 of probe card assembly 1500 may be used to impart the forces and movements shown in FIG. 20 to one or more of the probe substrates 108. Leveling screw assemblies 1504 may also be used to alter a shape of one or more of the probe substrates 108 as shown in FIG. 21. As yet another example, the alignment plate 2402 and AP assemblies 2408 of probe card assembly 2400 may be used to impart the forces and movements shown in FIGS. 20 and 30 to one or more of the probe substrates 108, and AP assemblies 2408 may also be used to alter a shape of one or more of the probe substrates 108 as shown in FIG. 21.

The movement imparted to the probe substrates 108 during step 3106 may cause the spring contacts 808, 810 of an interposer 804 (see FIG. 8) to scrub across contact terminals (not shown) on the mounting assembly 104 and/or the probe substrates 108. As is known, scrubbing a contact across a terminal improves the electrical connection between the contact and the terminal. This is because the scrubbing action may break through nonconductive (electrically) or highly electrically resistive contaminates (e.g., oxide) on the terminals.

At step 3108, the positions of the probe substrates (now aligned and/or planarized with the die terminals 22 as per step 3106) are locked into place. Although not shown, the first adjustment mechanism 106 and the second adjustment mechanism 110 may be configured to lock the probe substrates 108 into a selected position with respect to the mounting assembly 104. For example, the differential screw assemblies 404 of probe card assembly 400 may include a mechanism to lock screw 1102 so that it cannot rotate 1108. Screw 1202 of cam assemblies 406 may include a similar locking mechanism. Alternatively, the differential screw assemblies 404 and the cam assembly 406 may be configured such that screw 1102 and screw 1202 resist rotation unless a rotation tool (not shown) is applied to the screws 1102, 1202. In such a case, step 3108 is performed by implication once step 3106 is completed. The screws 1802 and 2204 of, respectively, leveling screw assemblies 1504 and lateral adjustment assemblies 2202, and differential screws 2708 of the AP assemblies 2408 may be similarly configured with a locking mechanism (not shown) or to resist rotation unless a rotation tool is applied. Regardless, locking nut 1804 of leveling screw assembly 1504, as described above, locks and stops the leveling screw assembly 1504 from moving laterally in passage 1702. Similarly, the locking screws 2702 of the AP assemblies 2408 of the probe card assembly 2400 stop the AP assemblies 2408 from moving laterally in passages 2904 and 2906 (see FIG. 29). If such assemblies or assemblies are used to make lateral adjustment at step 3106, the locking nut 1804 and locking screws 2702 are locked down at step 3108.

As discussed above, the probe substrates 108 are adjusted at step 3106 relative to the mounting assembly 104. Because the mounting assembly 104 may be attached to a prober (e.g., like prober 2 of FIG. 1) and a wafer 12 to be tested may be disposed in the prober 2, adjusting the probe substrates 108 (and the attached probes 112) with respect to the prober 2 adjusts the probe substrates (and the attached probes 112) with respect to the prober 2 and the die terminals 22 of the wafer 12. Once the probes 112 are planarized and/or aligned with respect to the die terminals 22 of the wafer 12 to be tested, the stage 6 can move the die terminals 22 into contact with the probes 112, and the dies of the wafer 12 can be tested.

Although specific embodiments and applications of the invention have been described in this specification, there is no intention that the invention be limited to these exemplary embodiments and applications or to the manner in which the exemplary embodiments and applications operate or are described herein. For example, the screw 1202 of the cam assemblies 406 may extend through the top of the mounting assembly 104 so that the cam assemblies 406 are adjustable from the top of the probe card assembly 400 rather than from the bottom as shown in FIG. 12A. As yet another example, the various examples of the first adjustment mechanism 106 and the second adjustment mechanism 110 (see FIGS. 2A and 3) may be mixed and matched. As just one example, the cam assemblies 406 in probe assembly 400 may be replaced by the bracket 1510 and set screws 1506 of probe card assembly 1500. Similarly, the cam assemblies 406 may replace the bracket 1500 and set screws 1506 in probe card assembly 1500. As yet another example, some of the leveling screw assemblies 1504 in the probe card assembly 1500 may be replaced with the differential screw assemblies 404 of probe card assembly 400. Thus, forces 2006 illustrated in FIG. 20 may be push only forces. As still another example of a modification to the embodiments described herein, the flexible wires 1704 of probe card assembly 1500 may be used in probe card assembly 400 in place of interposers 804. Similarly, the interposers 804 of probe card assembly 400 may be used in place of the wires 1704 in probe card assembly 1500. As yet another example, first adjustment mechanisms 106 and the second adjustment mechanism 110 may be driven by automatic actuating devices in response to control signals generated by a computer or other automatic control system. As still another example of variations to the exemplary embodiments described herein, although those embodiments are probe card assemblies, the alignment and planarization techniques described herein are generally applicable to use with any device comprising one or more substrates that must be planarized and/or aligned.

The invention claimed is:

1. A method of making a probe card assembly, said method comprising:
    attaching a plurality of probe head assemblies to a mounting structure, each said probe head assembly comprising a probe substrate with a set of probes disposed to contact a device to be tested, an alignment plate, and a plurality of coupling mechanisms that couple said probe substrate to said alignment plate, wherein after said attaching, said mounting structure is disposed between said probe substrate and said alignment plate of each of said probe head assemblies;
    after attaching said probe head assemblies to said mounting structure and while said coupling mechanisms are unlocked, moving with respect to said mounting structure at least one of said probe head assemblies substantially in parallel with respect to a plane of said mounting structure; and
    locking said probe head assemblies and thereby impeding movement of said probe head assemblies substantially in parallel with respect to said plane of said mounting structure.

2. The method of claim 1 further comprising moving with respect to said mounting structure at least part of at least one of said probe head assemblies substantially perpendicular with respect to said plane of said mounting structure.

3. The method of claim 2, wherein said moving said at least one of said probe head assemblies substantially perpendicular causes rotation of said at least one of said probe head assemblies about an axis that is substantially parallel to said plane of said mounting structure.

4. The method of claim 3 further comprising attaching said mounting structure to an apparatus for probing a semiconductor wafer, and wherein said moving said at least one of said probe head assemblies substantially parallel and said moving said at least one of said probe head assemblies substantially perpendicular align said sets of probes with said semiconductor wafer.

5. The method of claim 1 further comprising changing a shape of said probe substrates of at least two of said probe head assemblies.

6. The method of claim 5, wherein said shape is a shape of a surface to which a set of said probes is attached.

7. The method of claim 1, wherein said attaching comprises biasing ones of said probe head assemblies s away from others of said probe head assemblies.

8. The method of claim 1, wherein said moving said at least one of said probe head assemblies substantially parallel comprises adjusting a shaft extending from said mounting structure alter a separation of adjacent probe head assemblies.

9. The method of claim 1, wherein said moving said at least one of said probe head assemblies substantially parallel comprises moving a cam that affects movement of one of said probe head assemblies.

10. The method of claim 1, wherein said moving said at least one of said probe head assemblies substantially parallel comprises adjusting a set screw that affects movement of one of said probe head assemblies.

11. The method of claim 1, wherein said moving said at least one of said probe head assemblies substantially perpendicular comprises moving a plurality of adjustable shafts extending from said mounting structure that affect movement of one of said probe head assemblies.

12. The method of claim 11, wherein said shafts are flexible in directions that are substantially parallel with said plane of said mounting structure.

13. The method of claim 1, wherein said moving said at least one of said probe head assemblies substantially parallel causes rotation of said at least one of said probe head assemblies about an axis that is substantially perpendicular to said plane of said mounting structure.

14. The method of claim 1, wherein said attaching comprises attaching each of said probe head assemblies such that:
    a plane of said alignment plate of said probe head assembly is substantially parallel with said plane of said mounting structure, and
    said coupling mechanisms of said probe head assembly pass through passages in said mounting structure that are substantially perpendicular to said plane of said mounting structure.

15. The method of claim 14, wherein said attaching further comprises attaching each of said probe head assemblies such that said mounting structure is directly between said entire alignment plate and said entire probe substrate.

16. The method of claim 14, wherein said moving said at least one of said probe head assemblies substantially parallel comprises applying a force to said alignment plate of each of said at least one of said probe head assemblies with a leverage tool that extends through a passage in said alignment plate and into a corresponding hole in said mounting structure.

17. The method of claim 14, wherein said locking comprises tightening a coupling of each of said probe head assemblies to said mounting structure.

18. The method of claim 14 further comprising altering a planar orientation of said probe substrate of at least one of said probe head assemblies with respect to said plane of said alignment plate of said at least one of said probe head assemblies.

19. The method of claim 18, wherein said altering said planar orientation comprises activating at least one of said coupling mechanisms of said at least one of said probe head assemblies to alter a distance between said alignment plate of said at least one of said probe head assemblies and a portion of said probe substrate to which said at least one of said coupling mechanisms is coupled.

20. The method of claim 19, wherein said altering comprises rotating a surface of said probe substrate of said at least one of said probe head assemblies with respect to said plane of said alignment plate, wherein said set of probes extend from said surface of said probe substrate.

21. The method of claim 19, wherein said altering comprises changing a shape of a surface of said probe substrate of said at least one of said probe head assemblies, wherein said set of probes extend from said surface of said probe substrate.

22. The method of claim 1, wherein said moving said at least one of said probe head assemblies substantially parallel comprises moving said at least one of said probe head assemblies until said sets of probes on each of said probe head assemblies are disposed with respect to one another to correspond to a pattern of terminals of said device to be tested, wherein a number of said terminals exceeds a number of said probes in any one of said sets of probes.

* * * * *